United States Patent [19]
Akiyama et al.

[11] Patent Number: 6,136,425
[45] Date of Patent: Oct. 24, 2000

[54] SUPPORT FOR PRINTING MATERIAL, PRINTING MATERIAL EMPLOYING THE SAME AND MANUFACTURING METHOD THEREOF

[75] Inventors: Takeo Akiyama, deceased, late of Tokyo; by Yasuo Akiyama, legal representative, Minami-Koma-gun, both of Japan

[73] Assignee: Konica Corporation, Tokyo, Japan

[21] Appl. No.: 09/038,631

[22] Filed: Mar. 12, 1998

[30]     Foreign Application Priority Data

Mar. 17, 1997  [JP]  Japan ................................. 9-062804

[51] Int. Cl.⁷ ................................ B32B 7/12; B32B 5/22
[52] U.S. Cl. ..................... 428/314.2; 428/317.5; 428/317.7; 428/317.9
[58] Field of Search ............... 428/314.2, 317.5, 428/317.7, 317.9

[56] References Cited

U.S. PATENT DOCUMENTS

| | | |
|---|---|---|
| 3,797,388 | 3/1974 | Kaminstein . |
| 4,330,605 | 5/1982 | Boston . |
| 4,507,383 | 3/1985 | Tsuruta et al. . |
| 4,542,089 | 9/1985 | Cadwell et al. . |
| 4,596,189 | 6/1986 | Halpern et al. . |
| 4,861,644 | 8/1989 | Young et al. . |
| 5,663,031 | 9/1997 | Hauquier et al. . |

*Primary Examiner*—Jerry D. Johnson
*Attorney, Agent, or Firm*—Finnegan, Henderson, Farabow, Garrett & Dunner, L.L.P.

[57]     ABSTRACT

Disclosed is a printing material comprising a support comprising a void layer with voids, and a light sensitive layer or a heat sensitive layer provided on the void layer, wherein the void volume of the void layer is not less than 0.01 ml/m².

12 Claims, No Drawings

SUPPORT FOR PRINTING MATERIAL, PRINTING MATERIAL EMPLOYING THE SAME AND MANUFACTURING METHOD THEREOF

FIELD OF THE INVENTION

The present invention relates to a printing material support, and particularly to a printing material support suitable for a printing plate which gives an excellent water retention property and prevents stains from occurring at non-image portions.

BACKGROUND OF THE INVENTION

There are several printing methods, and planographic printing method is predominated at present. The planographic printing method is a method in which, employing a planographic printing plate with ink receptive image portions and ink repulsive non-image portions present at substantially the same plane, printing is carried out by supplying ink only to the image portions, and transfer the ink to material to be printed such as paper. That is, planographic printing method employs the difference of ink receptivity between image portions and non-image portions. In order to prepare such a planographic printing plate, a presensitized planographic printing plate (hereinafter referred to also as PS plate) is used. As described in T. Yonezawa, "PS Ban Gairon", pp. 18–81, Insatsu Gakkai Shuppanbu (1993), the PS plate herein referred to implies the following:

The PS plate implies a presensitized planographic printing plate comprising a hydrophilic aluminum support and provided thereon, a lipophilic light sensitive layer. The planographic printing plate is prepared by remaining the light sensitive layer at image portions and removing the light sensitive layer at non-image portions to expose the hydrophilic aluminum surface capable of forming a dampening water layer and repelling ink, according to lithography. There are a conventional PS plate, from which a planographic printing plate having a dampening water layer as an ink repelling layer is prepared, and a waterless PS plate, from which a waterless planographic printing plate having a silicone rubber layer as an ink repelling layer is prepared.

In the conventional PS plate, a grained aluminum plate is ordinarily employed as a support. The surface of the aluminum plate is required to have a water holding property and an excellent adhesion to a lipophilic light sensitive layer, such that the light sensitive layer is not removed from the surface during printing. Therefore, the surface of the aluminum plate is ordinarily grained, and optionally subjected to surface treatment such as anodizing treatment to improve both water holding property and adhesion to a lipophilic light sensitive layer. The conventional PS plate is widely employed.

The conventional PS plate provides a practical excellent printing plate. However, with conventional printing plates, which employ a grained aluminum plate as the support, it is difficult to control the balance between ink and a dampening water during printing, which is likely to cause printing failure such as stain occurrence and ink emulsification according to printing conditions. Further, such printing plates occasionally result in lowering of small dot reproduction due to halation, which is caused by the surface-roughened aluminum plate.

There are two plate making processes in the printing field, one is a direct plate making process of preparing a direct printing plate by directly forming an image necessary to print on a plate, and the other an indirect plate making process of preparing an indirect printing plate by forming an image on an intermediate medium such as a drum, and then transferring the formed image to a plate.

As desk top publishing (DTP) systems progress or computer to plate (CPT) plate making process develops, the direct or indirect plate making process has been increasingly used. As one embodiment of the direct plate making processes, there is a method comprising the steps of imagewise transferring a lipophilic transfer layer to the roughened surface of a support to prepare a printing plate, however, the roughened surface occasionally causes problems in that the transferred small dots have fringes around the periphery, which result in print images of poor quality.

As one embodiment of the indirect plate making processes, there is a method of preparing an off-set master for a printing plate. The off-set master has an image receiving layer comprised of zinc oxide and a binder on a paper support or a plastic film support. Toner images are formed on the image receiving layer employing a copy machine or a laser printer to prepare an off-set printing plate. The off-set printing plate has lipophilic, toner image portions and non-image portions without toner images, which are made to be hydrophilic by an etching solution containing, for example, potassium cyanide.

The off-set master requires etching before printing, whereby non-image portions of the master are made to be hydrophilic. However, the etching treatment still has a problem in that it is insufficient to make the non-image portions hydrophilic, and the master is likely to produce stains at the non-image portions.

As is described above, a support for a planographic printing plate having satisfactory properties has not yet been obtained.

SUMMARY OF THE INVENTION

An object of the invention is to provide a support for a printing plate, which gives high water tolerance (high latitude to dampening water) and excellent small dot reproduction, and prevents stains from occurring at non-image portions of the printing plate, and to provide a presensitized planographic printing plate and printing plate employing the support.

Another object of the invention is to provide a method of manufacturing a planographic printing plate employing the support.

DETAILED DESCRIPTION OF THE INVENTION

The above object of the invention can be attained by the followings:

1. A support for a printing plate, the support comprising a substrate and provided thereon, at least one void layer,
2. the support of item 1 above, wherein the void layer works as a water retention layer,
3. the support of item 1 or 2 above, wherein the void volume of the void layer is not less than 0.01 ml/M$^2$,
4. the support of item 1, 2 or 3 above, wherein the void ratio of the void layer is not less than five volume % of the void layer,
5. the support of item 1, 2, 3 or 4 above, wherein the voids of the void layer have a first opening on the surface of the void layer and the voids connect other voids having a second opening on the surface of the void layer in the interior of the void layer, 6. the support of item 1, 2, 3, 4 or 5 above, wherein the void layer contains at least one of a binder and fine particles,
7. the support of item 1, 2, 3, 4, 5 or 6 above, wherein the void layer is provided on the substrate by a coating method,
8. a presensitized planographic printing plate comprising the support of item 1, 2, 3, 4, 5, 6 or 7 above and provided thereon, at least one radiation sensitive composition,
9. a method of preparing a printing plate, the method comprising the steps of imagewise exposing the presensitized planographic printing plate of item 8, and developing the exposed plate to form hydrophilic portions and lipophilic portions on the support,
10. a method of preparing a printing plate, the method comprising the steps of superposing the support of item 1, 2, 3, 4, 5, 6 or 7 above on a donor sheet comprising a base and provided thereon, at least one heat sensitive transfer layer containing a transferable substance, so that the void layer contacts the transfer layer, and applying heat, light or pressure to the superposed material to imagewise transfer the transfer layer to be transferred to the support,
11. a printing method comprising the step of supplying dampening water and a printing ink to the printing plate prepared by the method of item 9 or 10,
12. a printing material comprising a support comprising a void layer with voids, and a light sensitive layer or a heat sensitive layer provided on the void layer, wherein the void volume of the void layer is not less than 0.01 ml/m$^2$,
13. the printing material of item 12, wherein the void layer is provided on a substrate,
14. the printing material of item 12, wherein the void volume of the void layer is not less than 0.5 ml/m$^2$,
15. the printing material of item 12, wherein the void volume of the void layer is 0.5 to 40 ml/m$^2$,
16. the printing material of item 12, wherein the void ratio of the void layer is not less than 5% of the void layer,
17. the printing material of item 12, wherein the void ratio of the void layer is 20 to 80% of the void layer,
18. the printing material of item 13, wherein the voids have an opening at the surface of the void layer on the substrate side or at the surface of the void layer opposite the substrate,
19. the printing material of item 13, wherein the voids are voids having at least two openings at the surface of the void layer on the substrate side or at the surface of the void layer opposite the substrate,
20. the printing material of item 12, wherein the void layer contains at least one of a hydrophilic binder and fine particles, or
21. the printing material of item 12, wherein the heat sensitive layer is provided on the void layer of the support by superposing the support on a donor sheet comprising a base and provided thereon, a heat sensitive transfer layer, so that the void layer contacts the transfer layer, and then imagewise applying heat, light or pressure to the superposed material to imagewise transfer the transfer layer to the void layer.

The present invention will be detailed below.

The printing material of the invention comprises a support comprising a substrate and provided thereon, a void layer with voids, and a light sensitive layer or a heat sensitive layer provided on the void layer, wherein the void volume of the void layer is not less than 0.01 ml/m$^2$. The light sensitive layer or the heat sensitive layer may be imagewise provided on the void layer of the support.

It is necessary that the void layer in the support of the invention contains voids. The voids of the void layer are formed, for example, between components selected from a hydrophilic binder and fine particles.

There are various methods of forming voids in a layer, and generally, a void forming method is different depending on different components contained in the void layer. The typical void forming methods will be explained below. The methods include:

(1) a method of coating a coating solution containing at least two kinds of polymers on a substrate and then causing phase separation of these polymers during drying to form voids.

(2) a method of coating a coating solution containing solid fine particles and a hydrophilic binder on a substrate, drying the coated layer, and then immersing the dried layer in water or an organic solvent to form voids.

(3) a method of coating a coating solution containing a compound capable of foaming during layer formation on a substrate, and then foaming the compound during drying to form voids.

(4) a method of coating a coating solution containing porous fine particles and a hydrophilic binder on a substrate to form voids between the porous fine particles and voids in the porous fine particles.

(5) a method of coating a coating solution containing a hydrophilic binder and solid fine particles in an amount by volume or weight identical to or more than the hydrophilic binder on a substrate to form voids between the solid fine particles.

(6) a method of preparing a coating solution containing fine inorganic particles having an average particle size of 0.1 μm or less, and coating the solution on a substrate wherein the fine inorganic particles are flocculated to form a secondary order particle or a three dimensional structure during preparation of the coating solution or during the coating process to form voids.

In the invention, any of the above void forming methods can be employed, but method (4), (5) or (6) is preferably employed, and method (5) or (6) is especially preferably employed, in that the support having high physical durability as a printing plate support can be manufactured at low cost.

In the void layer containing porous solid fine particles and a hydrophilic binder formed according to the method (4), the porous solid fine particles are preferably secondary order particles formed by flocculation of primary order particles having an average size of 0.1 μm or less. The porous solid fine particles include flocculated secondary order particles of calcium carbonate, natural or synthetic silica, alumina, zinc oxide, or iron powder. Of these, the preferred is synthetic silica or alumina.

The solid fine particles used in the method (5), in which the void layer contains a hydrophilic binder and the solid fine particles in an amount by volume or weight identical to or more than the hydrophilic binder, are not specifically limited, but include fine particles of natural or synthetic silica, alumina, aluminum hydroxide, zinc oxide, zinc hydroxide, light calcium carbonate, heavy calcium carbonate, calcium hydroxide, titanium oxide, barium sulfate, magnesium hydroxide, magnesium carbonate, kaolin, clay, talc, zeolite, aluminum silicate, diatomaceous earth, mica, synthetic hydrosulfite, potassium titanate, basic magnesium sulfate, or aluminum borate. These solid fine particles are described in detail in, for example, Filler Kenkyu Kai Hen, Taisei Company, on May 31, 1991.

The size of the solid fine particles used in the method (5) is generally 0.003 to 10 $\mu$m, and preferably 0.006 to 3 $\mu$m. The solid fine particle content ratio to the hydrophilic binder in the void layer is generally 1 to 10 by volume, preferably 1.5 to 8 by volume, or generally 1 to 15 by weight, preferably 1.5 to 10 by weight.

The solid fine particles used in the method (6) wherein the solid fine particles are flocculated to form a secondary order particle or a three dimensional structure during preparation of the coating solution or during the coating process to form voids include those used in the above method (5), and especially preferably synthetic silica.

Among synthetic silica, the preferred is fine silica particles synthesized by a gas phase reaction, or colloidal silica synthesized by a wet method. The fine silica particles synthesized by a gas phase reaction are especially preferable in that they are suitable for this invention since they are likely to be flocculated due to a relatively small amount of a silanol group present on the silica surface. The synthetic silica may be the silica itself or silica whose surface is treated with alumina and so on.

The average size of the solid fine particles in the void layer according to the method (6) is generally 3 to 200 nm, and preferably 6 to 100 nm. The solid fine particle content ratio to the hydrophilic binder in the void layer is generally 0.5 to 10 by volume, preferably 1 to 8 by volume, or generally 0.5 to 15 by weight, preferably 1 to 10 by weight.

The hydrophilic binder used in the void layer of the support in the invention is a binder such that its coating layer repels water, and in other words, is a binder having affinity to water such as solubility, swelling property, absorption property or wettability to water. The hydrophilic binder is preferably a binder such that its coating layer has a contact angle to water at 25° C. of preferably less than 30°, and more preferably less than 10°. The hydrophilic binder in the invention is also preferably a binder such that its coating layer is dissolved in water so that its contact angle can not be measured. Such a binder includes a binder having, in its chemical structure, a hydroxy group, a carboxy group, a group having a secondary or tertiary amino group, an amino group, an amido group, a carbamoyl group, a sulfonic acid group, a phosphonic acid group, or a mercapto group.

The typical hydrophilic binder includes gelatin or its derivative, casein, alginic acid, polyacrylic acid or its salt, gum arabic, xanthene gum, κ-carrageenin, λ-carrageenin, τ-carrageenin, locust bean gum, carboxymethyl cellulose, hydroxyethyl cellulose, dextrane, pullulan, polyvinyl alcohol or its derivative, polyacryl amide, polyethylen oxide, polyethylene glycol, polyalkyleneoxide copolymers disclosed in Japanese Patent O.P.I. Publication Nos. 7–195826 and 7–9757, polypropylene glycol, polyvinyl pyrrolidone, and polyvinyl butyral. Of these, the preferred is polyvinyl alcohol or its derivative. Gelatin or its derivative is also preferable in view of excellent chemical resistance.

The average molecular weight of the hydrophilic binder is not specifically limited, but is preferably 2,000 to 1,000,000.

The hydrophilic binder content of the void layer in the invention is preferably 0.1 to 20 g/m$^2$, although it may be different depending on the void layer thickness or the solid fine particle content.

The void volume of the void layer of the support in the invention is not specifically limited, and is preferably not less than 0.01 ml/m$^2$, more preferably not less than 0.5 ml/m$^2$, and most preferably 0.5 to 40 ml/m$^2$.

The void ratio of the void layer is not specifically limited, and is preferably not less than 5%, more preferably not less than 15%, and most preferably 20 to 80%.

The dry thickness of the void layer is determined mainly by the void ratio and the void volume of the layer, and is preferably 0.2 to 60 $\mu$m, and more preferably 0.5 to 45 $\mu$m.

The void ratio of the void layer herein referred to is represented by the following equation employing the void volume and dry thickness of the void layer:

Void ratio (%)=(Void volume/dry thickness) ×100 wherein unit of void volume is ml/m$^2$, and unit of dry thickness is $\mu$m. The void volume is represented by a liquid absorption amount (ml/m2) for an absorption time of 2 seconds, measured according to a method described in J. TAPPI, Paper pulp Test No. 51 (1987), "liquid absorption test of paper or paper board (Bristow Method)". The liquid used in this method is pure water (deionized water), but may contain a water soluble dye in an amount of less than 2% in order to easily the area to be measured.

The voids of the void layer in the invention preferably have an opening at the interface between the void layer and another layer (for example, the interface between the void layer and a light sensitive layer or a heat sensitive layer provided on the void layer, the interface between the void layer and a substrate wherein the void layer is provided directly on the substrate, or the interface between the void layer and the atmosphere wherein the void layer is an outermost layer).

The voids of the void layer in the invention are preferably voids having at least two openings. There are two interfaces between the void layer and another layer, as described above. The voids having at least two openings herein referred to may be voids having at least two openings at one of the two interfaces or voids having at least one opening at each of the two interfaces. The voids are more preferably voids having two or more openings at each of the two interfaces. In the invention, the voids are still more preferably voids having 2 to 32 openings, and most preferably 2 to 16 openings at each of the two interfaces. A method for forming such voids includes a method dispersing, in the void layer, two or more kinds of solid fine particle groups which are different in an average particle size, in which preferably, the average particle size of one group is two or more times as large as that of others. In the invention, the voids having two or more openings are preferably 50% or more by number, more preferably 70% or more by number, and most preferably 80% or more by number, based on the total void number.

In the support for a printing plate (hereinafter referred to as the support of the invention) in the invention comprising a substrate and provided thereon, a void layer, the substrate are conventional ones suitable for the printing plate.

The substrate includes a plate or a sheet of a metal such as aluminum, zinc, chromium, copper, magnesium, nickel or iron, or its alloy, a plate or a sheet of paper, glass or ceramics, a plate or a sheet of a plastic such as polyethylene terephthalate (PET) whose surface is matted and made hydrophilic, a plate or a sheet in which a layer of a metal such as aluminum, zinc or chromium is provided on a plastic sheet or plate, and a plate or a sheet in which a hydrophilic polymer layer is provided on another substrate. The examples of the hydrophilic polymer are preferably cellulose derivatives, polyvinyl alcohol, polyvinyl pyrrolidone, polyacryl amide, polyethylene glycol, gelatin, and gum arabic.

The plastic substrate is preferably a polyester film, more preferably a PET film, and most preferably a two axially oriented PET film, in view of dimensional stability to water or heat. Further, a film such as a polyethylene naphthalate (PEN) film is preferable in view of dimensional stability. A film such as acetate, polyvinyl chloride, polystyrene, polypropylene, polycarbonate, or polyimide is preferably used.

The surface of the substrate is preferably subjected to subbing treatment in order to improve coatability or adhesion property. The surface may be subjected to plasma treatment or corona discharge treatment. An anti-halation layer containing a dye or pigment may be provided on the surface of the substrate in order to prevent halation.

The surface of the substrate opposite the void layer is preferably roughened in order to improve sliding property of a printing plate employing the substrate or to improve contact between an original and a printing plate employing the substrate at imagewise exposure. A back coat layer is preferably provided on the surface of the substrate opposite the void layer. The back coat layer can be comprised of a silicone resin and so on.

The thickness of the substrate is ordinarily 12 to 2000 $\mu$m, and preferably 20 to 500 $\mu$m.

Next, the printing material of the invention and a method of preparing a printing plate therefrom will be explained below.

The printing material of the invention includes a presensitized planographic printing plate comprising the support described above, and provided thereon, at least one light sensitive layer containing a radiation sensitive composition. The radiation sensitive composition herein referred to is a composition causing physical or chemical change according to imagewise radiation exposure.

The radiation sensitive compound used in the radiation sensitive composition in the invention is reactive to radiation, particularly light (therefore, radiation sensitive, hereinafter referred to as also light sensitive), and bring about change in its property sufficient to form an image according to light exposure. The light sensitive compound may be a compound producing a negative or positive image.

The light sensitive compound constituting a negative working light sensitive composition includes a diazo compound or an azide compound. The diazo compound is a compound containing at least one diazo group in the molecule, includes an aliphatic diazo compound or an aromatic diazo compound. The diazo compound is preferably the diazo compound described later. The azide compound is a compound containing at least one —$N_3$ group in the molecule.

The light sensitive composition may contain one or more kinds of diazo resins, one or more kinds of azide compounds or a mixtures of diazo resins and azide compounds. The diazo resin or azide compound content of the negative working light sensitive composition in the invention is preferably 0.5 to 40 weight %, and more preferably 2 to 30 weight %.

The preferable diazo resin is a diazo resin represented by a condensation product of an aromatic diazonium salt with formaldehyde or acetoaldehyde. The especially preferable diazo resin is a salt of a condensation product of p-diazodiphenylamine with formaldehyde or acetoaldehyde, for example, an inorganic salt of a diazo resin such as a reaction product of the above salt with a hexafluorophosphate, a tetrafluoroborate, a perchlorate or a periodate, or an organic salt of a diazo resin such as a reaction product of the above salt with a sulfonic acid (for example, p-toluenesulfonic acid or its salt), a phosphinic acid (for example, benzenephosphinic acid or its salt), or a hydroxy group-containing compound (for example, 2,4-dihydroxybenzophenone, or 2-hydroxy-4-methoxybenzophenone-5-sulfonic acid or its salt) as disclosed in U.S. Pat. No. 3,300,309.

Another negative working light sensitive composition includes a photopolymerizable light sensitive composition. The photopolymerizable compound used in the light sensitive composition is not specifically limited, and a conventional photopolymerizable compound.

The photopolymerizable compound includes those as disclosed in Japanese Patent Publication Nos. 35–5093, 35–14719 and 44–28727, and includes an acrylic acid or methacrylic acid ester of a polyol such as diethylene glycol di(meth)acrylate, triethylene glycol di(meth)acrylate, pentaerythritol tri(meth)acrylate, or trimethylolpropane tri (meth)acrylate; a bis(meth)acryl amide such as methylenebis(meth)acryl amide or ethylenebis(meth)acryl amide; or a urethane group-containing unsaturated monomer, for example, a reaction product of a diisocyanate with a diol mono(meth)acrylate, such as di-(2'-methacryloxyethyl)-2-4-tolylenediurethane di-(2-acryloxyethyl)-2-4-trimethylenediurethane. The photopolymerizable compound content of the photopolymerizable light sensitive composition in the invention is not specifically limited, and preferably 10 to 80 weight %.

The photopolymerizable light sensitive composition can contain a photo-polymerization initiator. The photopolymerization initiator may be any polymerization initiator, and includes carbonyl compounds, organic sulfur compounds, peroxides, redox compounds, azo or diazo compounds, halides and photo-reducing agents disclosed in J. Kosar, "Light Sensitive Systems", Paragraph 5. The examples thereof are disclosed in English Patent No. 1,459,563.

The example of the photo-polymerization initiator includes an aromatic ketone such as benzophenone, Michler's ketone (4,4'-bis(dimethylamino)benzophenone), 4,4-bis(diethylamino)-benzophenone, 4-methoxy-4'-dimethylaminobenzophenone, 2-ethylanthraquinone, phenanethraquinone, or another aromatic ketone; a benzoin ether such as benzoin, benzoinmethyl ether, benzoinethyl ether, or benzoinphenyl ether; methyl benzoin, ethyl benzoin or another benzoin; a 2-(o-chlorophenyl)-4,5-diphenylimidazole dimer, a 2-(o-chlorophenyl)-4,5-(m-methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4,5-diphenylimidazole dimer, a 2,4-di(p-methoxyphenyl)-5-phenylimidazole dimer, a 2-(2,4-dimethoxyphenyl)-4,5-diphenylimidazole dimer, a 2-(p-methylmercaptophenyl)-4,5-diphenylimidazole dimer, or a 2,4,5-triacrylimidazole dimer as disclosed in U.S. Pat. No. 3,479,185, British Patent No. 1,047,569, and U.S. Pat. No. 3,784,557. The photopolymerization initiator used in the invention is not limited thereto.

Thioxanthones such as 2,4-diethylthioxanthone can be used as another photo-polymerization initiator. In this case, as a polymerization promoting agent are used a conventional compound such as isoamyl p-dimethylaminobenzoate, ethyl p-dimethylaminobenzoate, N-methyldiethanol amine, or bisdimethylaminobenzophenone. The photo-polymerization initiator content of the photopolymerizable light sensitive composition in the invention is not specifically limited, and preferably 0.1 to 20 weight %.

The photopolymerizable light sensitive composition in the invention can contain a diazonium compound, a thermal polymerization inhibitor or a plasticizer.

As another negative working light sensitive compound, a photo-crosslinkable compound can be used. The photo-crosslinkable compound used in the light sensitive composition is not specifically limited, and a conventional photo-crosslinkable compound. The preferable photo-crosslinkable compound includes a compound having a photo-dimerizable group.

The compound having a photo-dimerizable group includes a compound having a group represented by the following formulae (1) through (8):

formula (1)

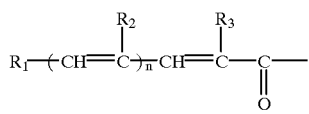

formula (2)

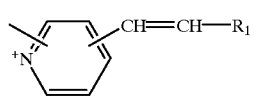

formula (3)

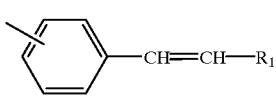

In formula (1), (2) or (3), $R_1$ represents an aryl group or a heterocyclic group, each of which may have a substituent such as an alkyl group having 1 to 10 carbon atoms, an alkoxy group, a nitro group, an amino group, an alkoxycarbonyl group, an acyloxy group, an alkanoyl group, a cyano group, or an azido group; $R_2$ represents a hydrogen atom or an alkyl group having 1 to 10 carbon atoms; $R_3$ represents a hydrogen atom, an alkyl group having 1 to 10 carbon atoms, an aryl group, an alkanoyl group or a cyano group; and n is an integer of 0 to 5.

formula (4)

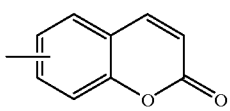

formula (5)

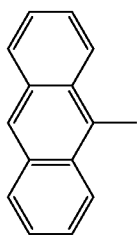

formula (6)

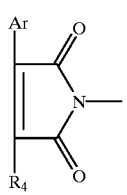

In formula (6), Ar represents an aryl group; and $R_4$ represents a hydrogen atom, a halogen atom, an alkyl group having 1 to 10 carbon atoms or a cyano group; and n is an integer of 0 to 5.

formula (7)

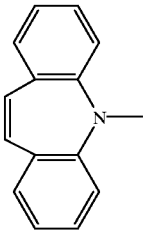

formula (8)

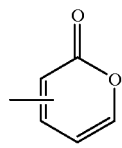

The examples represented by the above formulae include a cinnamic acid ester, a β-furylacrylic acid ester, an α-cyano-cinnamic acid ester, a p-azidocinnamic acid ester, a β-styrylacrylic acid ester, an α-cyano-β-styrylacrylic acid ester, a p-diphenylenediacrylic acid ester, a p-(2-benzoylvinyl)cinnamic acid ester, a β-naphthylacrylic acid ester, a cinnamilidenepyruvic acid ester, α-methyl-β-styrylacrylic acid ester, α-cyano-β-furylacrylic acid ester, α-dimethylaminocinnamic acid ester or an amide corresponding to the above ester, chalcones, benzylidene acetone, stilbazoles, stilbenes, α-phenylmaleimide, cumarines, pyrrones, anthracene, and dibenzoazepines.

These compounds having a photo-dimerizable group can be used singly or in combination.

The photo-crosslinkable composition preferably contains a sensitizing agent in addition to the above compounds having a photo-dimerizable group.

The examples of the sensitizing agent include 2,4,7-trinitro-9-fluorenoe, 5-nitroacenaphthene, p-nitrdiphenyl, p-nitroaniline, 2-nitrofluorenoe, 1-nitropyrene, N-acetyl-4-nitro-1-naphthylamine, N-benzoyl-4-nitro-1-naphthylamine, Michler's ketone, N-butylaciridon, 5-benzoylacenaphthene, 1,8-phthaloylnaphthaline, 1,2-benzanthracene, 9,10-β-phenanethraquinone, chlorobenzanthrone, N-phenylthioacridon, 1,2-benzanthraquinone, N-methyl-2-benzoylmethylene-β-naphthothiazole, 2-chlorothioxanthone, 2,4-dimethylthioxanthone, 2,4-diisopropylthioxanthone, eosine, erythrosine, and picramide. The examples of the sensitizing agent are not limited thereto.

The sensitizing agent is not always essential, but is used in order to improve efficiency in use of longer wavelength light.

The light sensitive compound used in the negative working light sensitive composition in the invention can be used singly or in combination.

The positive working light sensitive compound used in the light sensitive composition in the invention includes a quinone diazide compound. The example thereof includes a condensation product of a hydroxy or amino containing compound with 1,2-benzoquinone diazide-4-sulfonic acid chloride, 1,2-naphthoquinone diazide-4-sulfonic acid chloride, 1,2-naphthoquinone diazide-5-sulfonic acid chloride, or 1,2-naphthoquinone diazide-6-sulfonic acid chloride.

The hydroxy containing compound includes trihydroxybenzophenone, dihydroxy anthraquinone, bisphenol A, a phenol novolak resin, a resorcin benzaldehyde resin, and a pyrrogallol acetone resin. The amino containing compound includes aniline, p-aminodiphenylamine, p-aminobenzophenone, 4,4'-diaminodiphenyl amine, and 4,4-diaminobenzophenone.

The hydroxy containing compound is preferably a condensation product of phenols with aldehyde or ketone.

Examples of the phenols include a monohydric phenol such as phenol, o-cresol, m-cresol, p-cresol, 3,5-xylenol, carvacrol and thymol, a dihydric phenol such as catechol, resorcin or hydroquinone, and a trihydric phenol such as pyrogallol or phloroglucin. Examples of the aldehydes include formaldehyde, benzaldehyde, acetaldehyde, crotonaldehyde and furfural. Preferred are formaldehyde and benzaldehyde. Examples of the ketones include acetone, and methyl ethyl ketone.

The polycondensate resin includes a phenol-formaldehyde resin, a m-cresol-formaldehyde resin, a mixed m- and p-cresol-formaldehyde resin, a resorcin-benzaldehyde resin, and a pyrogallol-acetone resin.

The o-quinonediazide compound used in the invention include those disclosed in Japanese Patent O.P.I. Publication No. 58-43451. The examples thereof include conventional 1,2-quinonediazide compounds such as 1,2-benzoquinonediazide-sulfonate, 1,2-benzoquinonediazidesulfonamide, 1,2-naphthoquinonediazide-sulfonate and 1,2-naphthoquinonediazide-sulfonamide and, exemplarily, include those described in J. Kosar, Light-Sensitive Systems, John Wily & Sons, New York, pp. 339–352 (1965), WS. De Forest, Photoresist, Vol. 50, McGraw-Hill, New York (1975) and Nagamatus, Ken, Kankosei Kobunshi Kodan sha (1977).

The o-quinonediazide compound includes 1,2-benzoquinonediazide-4-sulfonic acid phenyl ester, 1,2-naphthoquinonediazide-5-sulfonic acid-2,4-dihydroxybenzophenone ester, 1,2-naphthoquinonediazide-5-sulfonic acid-2,3,4-trihydroxybenzophenone ester, a condensation product of 2 moles of 1,2-naphthoquinonediazide-5-sulfonic acid chloride with 1 mole of 4,4'-diaminobenzophenone, a condensation product of 2 moles of 1,2-naphthoquinonediazide-5-sulfonic acid chloride with 1 mole of 4,4'-dihydroxy-1,1'-diphenylsulfone, and a 1,2-quinonediazide. Other examples of the o-quinonediazide compound are 1,2-quinonediazide compounds described in Japanese Pat. Exam. Pub. Nos. 37-1953, 37-3627, 37/13109, 40/26126, 40/3801, 45/5604, 45/27345 and 51/13013, and Japanese Pat. O.P.I. Pub. Nos. 48/96575, 48/63802 and 48/63803.

Among the above described o-quinonediazide compounds is especially preferable an quinonediazide ester compound obtained by reacting 1,2-naphthoquinonediazide-4-sulfonylchloride with a hydroxy containing compound.

The light sensitive composition in the invention may contain various binders. The binders include various conventional binders.

The typical binders are described in U.S. Pat. No. 4,072, 527. The example thereof includes polyester resins, copoly (vinyl chloride-vinyl aceate), acryl resins, vinyl chloride resins, polyamide resins, polybutyral resins, epoxy resins, acrylate copolymers, vinyl acetate copolymers, phenoxy resins, polyurethane resins, polycarbonate resins, non-sulfur rubbers, polyethers, urea resins, alkyd resins, melamine resins, gum rosin resins, polyterpenes, cumaroindene resins, polyacrylo nitrile-butadiene, polyvinyl acetate, a hydroxy group-containing lipohilic polymer (for example, a copolymer of an alcoholic hydroxy group-containing monomer such as 2-hydroxyethylacrylate or 2-hydroxyethylmethacrylate and another monomer, or a copolymer of a phenolic hydroxy group-containing monomer such as N-(4-hydroxyphenyl)acrylamide, N-(4-hydroxyphenyl)methacrylamide, o-, m-, p-hydroxystyrene, or o-, m-, p-hydroxyphenylmethacrylate and another monomer), a polymer containing mainly a hydroxyethyl acrylate or hydroxyethyl methacrylate monomer unit as a repeated unit, natural resins such as shelac or rosin, polyvinyl alcohol, linear polyurethane resins, phthalated polyvinyl alcohol, cellulose derivatives such as cellulose acetate or cellulose acetate phthalate, an epoxy resin obtained by condensation of bisphenol A with epichlorhydrin, and an alkali soluble resin (for example, novolak resins, a vinyl polymer having an phenolic hydroxy group or a condensation product of a polyhydric phenol with aldehyde or ketone).

The above novolak resin includes a phenol-formaldehyde resin, a cresol-formaldehyde resin, a phenol-cresol-formaldehyde resin, and a copolycondensate of a p-substituted phenol, and phenol or cresol with formaldehyde.

The light sensitive composition can optionally contain various additives as described below, other than those described above. The additives include, for example, alkylethers for improving coatability (such as ethylcellulose or methylcellulose), a fluorine-containing surfactant, a nonioic surfactant (such as Pluronic L-64 produced by Asahidenka Co., Ltd.), a plasticizer for giving flexibility or antiabrasion to the coated layer (such as butylphthalate, polyethylene glycol, tributylcitrate, diethylphthalate, dibutylphthalate, dihexylphthalate, dioctylphthalate, tricresyl phosphate, tributyl phosphate, trioctyl phosphate, tetrahydrofurfuryloleate, an oligomer or polymer of acrylic acid or methacrylic acid), an lipophilic agent for improving a lipophilicity of image portions (such as an alcohol half ester of styrene-maleic anhydride copolymer disclosed in Japanese Patent O.P.I. Publication No. 55–527/1980, p-tert-butylphenol-formaldehyde resin or p-octylphenol-formaldehyde resin or an ester compound thereof with a quinonediazide compound), a stabilizing agent (such as phosphoric acid, phosphorous acid, an organic acid, for example, citric acid, oxalic acid, benzenesulfonic acid, naphthalene sulfonic acid, 4-methoxy-2-hydroxybenzophenone-5-sulfonic acid, glutaric acid), a development accelerator (such as higher alcohols or acid anhydrides), inorganic powder for maintaining a shape (for example, colloidal silica, calcium carbonate, or titanium oxide). The light sensitive composition preferably contain silicon oxide, aluminum oxide, t-bytylbenzoic acid or an organic dye having a polar group as disclosed in U.S. Pat. Nos. 3,370,971 and 2,965,511, organic pigment having a sulfonic acid group, a sulfonamido group, an aminomethyl group or phthalimidomethyl group in the side chain as disclosed in Japanese Patent Publication No. 41–2466 and U.S. Pat. Nos. 2,761,865 and compounds as disclosed in Japanese Patent O.P.I. Publication Nos. 56–167761, 56–167762, and 56–161827. The content of these additives in the light sensitive composition is generally 0.01 to 30 weight % based on the total solid component weight of the composition, although it varies depending on the objects of the usage.

The above light sensitive composition can be prepared by dissolving the above described light sensitive compound such as the quinonediazide compound, photopolymerizable compound, photo-crosslinkable compound, diazo compound or azide compound, the above described binder or optionally the additives in the following organic solvent.

The solvent includes a chlorine-containing solvent such as methylene chloride, trichloroethane, trichloroethylene, chlorobenzene, or carbontetrachloride; an alcoholic solvent such as furfuryl alcohol, tetrahydrofurfuryl alcohol or benzyl alcohol; an ether solvent such as dioxane or tetrahydrofurane, ethylene glycol monoalkyl ether such as ethylene glycol monomethyl (ethyl, propyl or butyl) ether; diethylene glycol monoalkyl ether such as diethylene glycol monomethyl (ethyl, propyl or butyl) ether; an ester solvent such as ethylene glycol ethylether acetate, diethylene glycol ethylether acetate or ethyl acetate; a nitrogen-containing solvent such as dimethylformamide, methylpyrrolidone, nitroethane or nitrobenzene; a ketone solvent such as methylethyl ketone, methylisopropyl ketone, cyclohexanone, methylcyclohexanone, or 4-methyl-4-methoxy-2-pentanone; and an aromatic solvent such as toluene or xylene and dimethylsulfoxide, and the solvent used is selected from the above solvents.

The method of providing the light sensitive composition layer on a support includes a coating method which comprises dissolving or dispersing the light sensitive composition in a solvent to obtain a coating solution, coating the solution on the support, and drying, or a transfer method which comprises forming the light sensitive composition layer on a peelable sheet, and transferring the layer to the support by applying heat and/or pressure.

The presensitized planographic printing plate in the invention may comprises a protective layer. The protective layer may be any conventional one, but is preferably a layer capable of being dissolved or dispersed during development. The protective layer may be peeled after imagewise exposure.

The material for forming the protective layer includes polyvinyl alcohol or celluloses. The material is optionally selected according to the kinds of the light sensitive compounds used in view of gas permeability. When an o-quinone diazide compound, a light sensitive compound, which produces gas during exposure, is used, material having a good gas permeability is preferably used in the protective layer for removing the gas produced. However, when a photo-polymerizable composition in which polymerization is inhibited by oxygen in atmosphere, is used, material having a poor gas permeability is preferably used in the protective layer.

The thickness of the protective layer is any, and is preferably 0.01 to 5 $\mu$m, and more preferably 0.03 to 1 $\mu$m in view of protective effect or developability.

The protective layer can be provided before or during processing by employing a film sheet capable of being peeled or removed. The film sheet include a film sheet comprised of polyethylene, polypropylene, or polyethylene terephthalate. The thickness of the protective layer is preferably 5 to 100 $\mu$m in view of processability or cost, although it varies depending on the film material used.

The printing plate in the invention is prepared by imagewise exposing the presensitized planographic printing plate in the invention, developing the exposed plate with an appropriate developing method (including transferring and/or peeling by heat and/or pressure, and immersing in developer) to form an image, whereby hydrophilic portions and lipophilic portions are formed on the support.

The developer used in the invention may be any, as long as it has developing capability necessary to develop the presensitized planographic printing plate in the invention. The preferable developer is an aqueous alkali solution. The alkali agent used in the developer (including developer replenisher) includes an inorganic alkali agent such as sodium silicate, potassium silicate, sodium hydroxide, lithium hydroxide, a di or trisodium phosphate, a di or tripotassium phosphate, a di or triammonium phosphate, sodium metasilicate, sodium bicarbonate, sodium carbonate, potassium carbonate, or ammonium carbonate, an organic alkali agent such as mono, di or triethanol amine, or tetraalkylammonum hydroxide, and an inorganic ammonium silicate. Of these agents, the silicate salt is preferable, and the alkali metal silicate is especially preferable.

The alkali agent content of the developer is not specifically limited, and is preferably 0.05 to 20 weight %, and more preferably 0.1 to 10 weight %.

The developer may contain an additive such as an organic solvent, a water soluble reducing agent, a surfactant or a chelating agent. The organic solvent includes an ester such as ethyl acetate, propyl acetate, butyl acetate, amyl acetate, benzyl acetate, ethylene glycol monobutyl acetate, butyl lactate, or butyl lebrate, a ketone such as ethyl butyl ketone, methyl isobutyl ketone, or cyclohexanone, an alcohol such as ethylene glycol monobutylether, ethylene glycol benzylether, ethylene glycol monophenylether, benzyl alcohol, methylphenyl carbinol, amyl alcohol, methyl amyl alcohol, glycol such as ethylene glycol or propylene glycol, an alkylated aromatic hydrocarbon such as xylene, a halogenated hydrocarbon such as methylene dichloride, ethylene dichloride, or monochlorobenzene. The solvent may be used in combination of two or more kinds. of these solvents, the preferred is ethylene glycol monophenylether, ethylene glycol benzylether, benzyl alcohol or propylene glycol.

The developer in the invention may contain the following additive, a neutral salt such as sodium chloride, potassium chloride, potassium bromide, as dislosed in Japanese Patent O.P.I. Publication No. 58–75152, a chelating agent such as ethylenediaminetetraacetic acid or nitrilotriacetic acid, as dislosed in Japanese Patent O.P.I. Publication No. 58–190952, a complex such as $[Co(NH_3)_6]Cl_3$ as dislosed in Japanese Patent O.P.I. Publication No. 59–121336, a cationic polymer such as a methylchloride quaternary salt of p-dimethylaminomethyl polystyrene as dislosed in Japanese Patent O.P.I. Publication No. 55–95946, an amphoteric polymer such as a copolymer of vinylbenzyltrimethylammonium chloride and sodium acrylate as disclosed in Japanese Patent O.P.I. Publication No. 56-142528, the reducing inorganic salt as disclosed in Japanese Patent O.P.I. Publication No. 57-192952, the inorganic lithium compound such as lithium chloride as disclosed in Japanese Patent O.P.I. Publication No. 58-5944, the organic lithium compound such as lithium benzoate as disclosed in Japanese Patent Publication No. 50-34442, the organic metal containing surfactant containing Si or Ti as disclosed in Japanese Patent O.P.I. Publication No. 59-75255, the organic boron containing compound disclosed in Japanese Patent O.P.I. Publication No. 59-84241, and an anionic surfactant such as a higher alcohol sulfate ester, an aliphatic alcohol phosphate ester, alkylarylsulfonic acid salts, sulfonic acid salts of dibasic aliphatic acid esters, a condensate of alkylnaphthalene sulfonic acid salts and formaldehyde, or alkylamidosulfonic acid salts.

Another method of preparing the printing material of the invention employing the support for a planographic printing plate in the invention will be explained below. The method comprises the steps of superposing the support of item 1, 2, 3, 4, 5, 6 or 7 described above on a donor sheet comprising a base and provided thereon, at least one heat sensitive layer (hereinafter referred to also as a transfer layer or an imaging layer) containing a transferable substance, so that the void layer contacts the heat sensitive layer, and applying heat, light or pressure to the superposed material to imagewise transfer the heat sensitive layer to be transferred to the void layer of the support.

The donor sheet used in the invention has at least one transfer layer containing a transferable substance on a base. The transfer layer is imagewise heated, light-exposed or pressed to cause imagewise physical or chemical change, and imagewise transferred to a support for a planographic printing plate according to phenomenon such as sublimation, heat fusion or ablation. The donor sheet is called a sublimation transfer sheet, a heat fusible transfer sheet and an ablation transfer sheet according to kinds of the phenomenon.

In the invention, the base includes a film of a plastic such as polyethylene terephthalate, polyethylene, polypropylene, polystyrene, polycarbonate, polyvinyl acetal, cellulose diacetate, cellulose triacetate, cellulose propionate, cellulose butyrate, cellulose acetate butyrate, or cellulose nitrate, or paper laminated with a film of a plastic such as polyethylene, polypropylene, or polystyrene. The thickness of the base is preferably 75 to 100 $\mu$m.

The transfer layer in the invention is preferably lipophilic, since a transfer layer at image portions is transferred to a hydrophilic support to obtain a printing plate. In other words, it is important that image portions are more ink receptive than non-image portions. In order to give such a property, the difference between contact angle of water to the image and that to non-image portions is 20° or more, and preferably 40° or more.

The sublimation transfer sheet comprises a base and provided on, a heat sensitive transfer layer containing a sublimation compound. Such a sublimation compound includes, besides a conventional thermal transfer dye, a compound subliming at a temperature and pressure at which the transfer layer is not softened nor fused and fuse. The sublimation compound may be colored or colorless.

The typical compound of the sublimation compound includes nitro dyes, azo dyes and anthraquinone dyes as disclosed on page 5–9 of Japanese Patent O.P.I. Publication No. 7-171941.

When the sublimation compound has low absorption to wavelength of light of a laser for exposure, a layer containing a light heat converting agent which absorbs the laser light and converts the light to heat, or a layer containing a light heat converting agent and the light sublimation compound in admixture is preferably provided on a base. The light sublimation compound is suitably selected from various dyes and pigment according to laser light wavelength.

A binder used in the layer containing the sublimation compound includes cellulose adducts; cellulose derivatives such as cellulose esters and cellulose ethers; polyvinyl alcohol; polyvinyl acetals such as polyvinyl formal, polyvinyl acetoacetal and polyvinyl butyral; vinyl resins such as polyvinyl pyrrolidone, polyvinyl acetate, polyacryl amide, styrene resins, poly(meth)acrylates, poly(meth)acrylic acids and (meth)acrylic acid copopymers; rubber resins; ionomer resins; olefin resins and polyesters.

The content ratio of the sublimation compound to the binder is preferably 1:20 to 5:1, and more preferably 1:5 to 4:1. The thickness of the layer containing the sublimation compound is ordinarily 0.05 to 20 $\mu$m, and preferably 0.1 to 10 $\mu$m. The layer containing the sublimation compound may be single or two or more layers which are the same or different in composition.

The heat fusible transfer sheet comprises a base and provided on, a heat sensitive transfer layer (a heat fusible layer) containing a heat-fusible or heat-softening compound.

The heat fusible layer contains at least one selected from the group consisting of heat-fusible compounds or thermoplastic resins. The heat fusible compound is a solid or semi-solid compound having a melting point of 40 to 150° C., the melting point measured by means of a melting point apparatus, Yanagimoto JP-2, and includes waxes, for example, vegetable wax such as carnauba wax, Japan wax, or esparto wax, animal wax such as bees wax, insect wax, shellac wax or spemaceti, petroleum wax such as paraffin wax, microcrystalline wax, polyethylene wax, ester wax or acid wax, and mineral wax such as montan wax, ozocerite or ceresine. The binder further includes a higher fatty acid such as palmitic acid, stearic acid, margaric acid or behenic acid, a higher alcohol such as palmityl alcohol, stearyl alcohol, behenyl alcohol, margaryl alcohol, myricyl alcohol or eicosanol, a higher fatty acid ester such as cetyl palmitate, myricyl palmitate, cetyl stearate or myricyl stearate, an amide such as acetoamide, propionic amide, stearic amide or amide wax, and a higher amine such as stearyl amine, behenylamine or palmityl amine.

The thermo plasticizer includes resins such as an ethylene copolymer, a polyamide resin, a polyester resin, a polyethylene resin, a polyurethane resin, a polyoleffin resin, an acryl resin, a polyvinyl chloride resin, a cellulose resin, a rosin resin, a polyvinyl alcohol resin, a polyvinyl acetal resin, an ionomer resin or a petroleum resin; elastomers such as natural rubber, styrene-butadiene rubber, isoprene rubber, chloroprene rubber or a diene copolymer; rosin derivatives such as ester gum, a rosin-maleic acid resin, a rosin phenol resin or a hydrogenated rosin; a phenol resin, terpenes, a cyclopentadiene resin or aromatic hydrocarbon resins. A heat fusible layer having an intended softening or melting point can be obtained by suitably using the above described heat fusible compound or thermoplastic resin.

The heat fusible layer optionally contains a colorant. The colorant includes inorganic pigment (for example, titanium dioxide, carbon black, graphite, zinc oxide, oprussian blue, cadmium sulfate, iron oxide and a chromate of lead, zinc or barium), organic pigment (for example, azo compounds, indigo compounds, anthraquinone compounds, anthanthrone compounds, triphenedioxazine compounds, vat dye pigment, phthalocyanine pigment or its derivative, and quinacridone pigment) and dyes (for example, direct dyes, dispersion dyes, oil soluble dyes, metal-containing oil soluble dyes and sublimable dyes). The heat fusible layer can further contain the lipophilic binder or reactive compound as described later.

When the heat fusible layer has low absorption to wavelength of light of a laser for exposure, a layer containing a light heat converting agent which absorbs the laser light and converts light to heat, or a layer containing a light heat converting agent and the light sublimation compound in admixture is preferably provided on a base. The light sublimation compound is suitably selected from various dyes and pigment according to laser light wavelength. The thickness of the heat fusible layer is preferably 0.2 to 2 $\mu$m, and more preferably 0.3 to 1.5 $\mu$m.

The ablation transfer sheet comprises a base and provided thereon, a heat sensitive transfer layer, which is transferred according to an ablation process.

The printing plate in the invention can be obtained by transferring the transfer layer of the ablation transfer sheet onto the support in the invention according to the ablation process to form a transfer image.

The expression, ablation process herein referred to implies a process in which a heat sensitive transfer layer (hereinafter referred to as an imaging layer) of the ablation transfer sheet is imagewise exposed to radiation or light, whereby the exposed imaging layer is quickly vaporized, and at least a part of the vaporized layer is transferred to a recording medium (such as the support in the invention) adjacent to the imaging layer to form a transfer image on the recording medium. The process is the same as "a process of forming a transfer image by laser removal" as disclosed in WO 6-510490.

The imaging layer is a layer which, when exposed to laser, absorbs the light to convert to heat, wherein the exposed portions are ablated, and at least a part of the ablated layer is transferred to a recording medium to form a transfer image on the recording medium.

The imaging layer can contain a light heat converting agent absorbing light to convert it to heat. The light-heat converting compound is preferably a compound which absorbs light and effectively converts to heat, although different due to a light source used. For example, when a semi-conductor laser is used as a light source, a compound having absorption in the near-infrared light region is preferably used. The near-infrared light absorbent includes a cyanine dye, an anthraquinone dye, an indoaniline-metal complex dye, an azulenium dye, a chloconium dye, a squalenium dye, a dithiol-metal complex dye, a chelate dye, and a naphthalocyanine-metal complex dye. The near-infrared light absorbent includes carbon black and graphite as disclosed in Japanese Patent O.P.I. Publication Nos. 62–123454 and 3–146565. The layer containing a light heat converting agent includes a metal deposited layer or a fine metal particle dispersing layer. The fine metal particles as a light heat converting agent are preferably fine particles iron oxide, iron, or chromium oxide, as employed in magnetic particles of magnetic material. The fine metal particles are preferable in view of cost or quality control, since they can provide a density per unit thickness higher than dyes or carbon black, and can provide an imaging layer on a base by a coating method which is different from a vaporizing method for forming a metal deposited layer.

The density (per unit thickness) of the imaging layer of the ablation transfer sheet in the invention is preferably not less than 3.0 μm, in order to obtain a light absorbing layer suitable for the ablation process. The imaging layer with higher density, when exposed to a laser, provides narrower heated portions of the layer, which are heated to higher temperature, resulting in higher efficiency of ablation.

The imaging layer in the invention can contain a binder. The binder includes celluloses such as nitrocellulose, ethylcellulose and methylcellulose; polyurethanes; polyvinyl chloride; polyesters; and acryl resins. Further, the imaging layer in the invention can contain the thermoplastic binder or lipophilic binder as described later. When the fine metal particles are used as a light heat converting agent, the binder used is preferably a binder having a functional group with dispersing property such as a sulfo group or a carboxy group. When the imaging layer is applied to a printing plate, the imaging layer preferably contains a lipophilic binder in order to give a printing property. The lipophilic binder is preferably a lipophilic polymeric compound with an acid value of 10 to 250.

The lipophilic polymer having an acid value of 10 to 250 includes polyamide, polyester, polycarbonate, polystyrene, polyurethane, polyvinyl chloride or their copolymer, a polyvinyl acetal, polyvinylbutyral, polyvinylformal, shellac, epoxy phenol, acryl or alkyd resin.

Among these polymers, the preferable is a copolymer obtained by copolymerizing a mixture of the following monomers (1) through (17).

Another monomer, which is capable of being copolymerized with the following monomers, may be added to the mixture of the monomers above described. The copolymer may be a copolymer modified with glycidylacrylate or glycidylmethacrylate.

(1) A monomer having an aromatic hydroxy group, for example, o-hydroxystyrene, p-hydroxystyrene, m-hydroxystyrene, o-hydroxyphenylacrylate, p-hydroxyphenylacrylate, m-hydroxyphenylacrylate, (2) A monomer having an aliphatic hydroxy group, for example, 2-hydroxyethylacrylate, 2-hydroxyethylmethacrylate, N-methylolacrylamide, N-methylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl)acrylamide, N-(2-hydroxyethyl) methacrylamide, hydroxyethylvinyl ether, (3) A monomer having an aminosulfonyl group, for example, m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl) methacrylamide, N-(p-aminosulfonylphenyl)acrylamide, (4) A monomer having a sulfonamido group, for example, N-(p-toluenesulfonyl)acrylamide, N-(p-toluenesulfonyl)-methacrylamide, (5) An α,β-unsaturated carboxylic acid, for example, acrylic acid, methacrylic acid, maleic acid, maleic anhydride, itaconic acid, itaconic anhydride, N-(p-toluenesulfonyl)acrylamide, N-(p-toluenesulfonyl)-methacrylamide, (6) A substituted or unsubstituted alkylacylate, for example, methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, (7) A substituted or unsubstituted alkylmethacylate, for example, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, glycidylmethacrylate, methacrylamide, (8) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (9) A monomer having a fluorinated alkyl group, for example, trifluoroethylacrylate, trifluoroethylmrthacrylate, tetrafluoropropylacrylate, tetrafluoropropylmethacrylate, hexafluoropropylmethacrylate, octafluoropentylacrylate, octafluoropentylmethacrylate, heptadecafluorodecylacrylate, heptadecafluorodecylmethacrylate, N-butyl-N-(2-acryloxyethyl)heptadecafluorooctylsulfonamide,

(10) A vinyl ether, for example, ethylvinyl ether, 2-chloroethylvinyl ether, propylvinyl ether, butylvinyl ether, octylvinyl ether, phenylvinyl ether,

(11) A vinyl ester, for example, vinyl acetate, vinyl chroloacetate, vinyl butate, vinyl benzoate,

(12) A styrene, for example, styrene, methylstyrene, chloromethystyrene,

(13) A vinyl ketone, for example, methylvinyl ketone, ethylvinyl ketone, propylvinyl ketone, phenylvinyl ketone,

(14) An olefin, for example, ethylene, propylene, isobutylene, butadiene, isoprene,

(15) N-vinylpyrrolidone, N-vinylcarbazole, N-vinylpyridine,

(16) A monomer having a cyano group, for example, tacrylonitrile, metacrylonitrile, 2-pentenenitrile, 2-methyl-3-butene nitrile, 2-cyanoethylacrylate, o-cyanostyrene, m-cyanostyrene, p-cyanostyrene,

(17) A monomer having an amino group, for example, N,N-diethylaminoethylmethacrylate, N,N-dimethylaminoethylacrylate, N,N-dimethylaminoethylmethacrylate, polybutadiene urethaneacrylate, N,N-dimethylaminopropylacrylamide, N,N-dimethylacrylamide, acryloylmorpholine, N-isopropylacrylamide, N,N-diethylacrylamide, The weight average molecular weight of the above copolymer is preferably 10,000 to 200,000 measured by gel permeation chromatography (GPC), but is not limited thereto.

The imaging layer preferably contains a reactive compound capable of improving adhesion of a transferred imaging layer to a recording medium by at least one of heating, pressure application and light exposure. The reactive compound includes a radical polymerizable compound, a cation polymerizable compound, a diazo compound or a coupling agent.

The radical polymerizable compound includes a conventional photopolymerizable or thermal polymerizable compound. The radical polymerizable compound is an ethylenically unsaturated compound capable of being polymerized by a radical, and is any compound, as long as it has at least one ethylenically unsaturated double bond in the molecule. The radical polymerizable compound may have any structure in the form of monomer, oligomer or polymer. The radical polymerizable compound can be used singly or in combination of two or more kinds in any content ratio, according to the objects of the usage.

The ethylenically unsaturated compound, which is capable of being polymerized by a radical, includes an unsaturated carboxylic acid such as acrylic acid, methacrylic acid, itaconic acid, crotonic acid, isocrotonic acid, or maleic acid or its salt, ester, urethane, amide or anhydride; acrylonitrile; styrene; unsaturated polyesters; unsaturated polyethers; unsaturated polyamides; and unsaturated polyurethanes. The examples include an acrylic acid derivative such as 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligo ester acrylate, N-methylol acryl amide, diacetone acryl amide, or epoxy acrylate; a methacrylic acid derivative such as methyl methacrylate, n-butyl methacrylate, 2-ethylhexyl methacrylate, lauryl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate, or 2,2-bis (4-methacryloxypolyethoxyphenyl)propane; an allyl compound such as alltl glycidyl ether, diallyl phthalate or triallyl trimellitate; and radical polymerizable or crosslinkable monomers, oligomers or polymers described in S. Yamashita et al., "Crosslinking agent Handbook", Taisei Co., Ltd. (1981), K. Kato et al., "UV, EB Hardenable Handbook (Materials)", Kobunshi Kankokai (1985), Radotek Kenkyukai, "UV, EB Hardening Technology, Application and Market", pp. 79, CMC Co. Ltd. (1989), and E. Takiyama, "Polyester Resin Handbook", Nikkan Kyogyo Shinbunsha (1988).

The radical polymerizable compound and radical polymerization initiator are preferably used in combination. The radical polymerization initiator includes triazine derivatives as described in Japanese Patent Publication Nos. 59-1281 and 61-9621, and Japanese Patent O.P.I. Publication No. 60–60104; organic peroxides as described in Japanese Patent O.P.I. Publication Nos. 59-1504 and 61-243807; diazonium compounds as described in Japanese Patent Publication Nos. 43-23684, 44-6413, and 47-1604, and U.S. Pat. No. 3,567,453; organic azides as described in U.S. Pat. Nos. 2,848,328, 2,852,379, and 2,940,853; o-quinonediazides as described in Japanese Patent Publication Nos. 36-22062, 37-13109, 38-18015 and 45-9610; onium compounds as described in Japanese Patent Publication No. 55-39162, Japanese Patent O.P.I. Publication No. 59–14023, and "Macromolecules", Vol. 10, 1307 (1977); azo compounds as described in Japanese Patent Publication No. 59-142205; metal arene complexes as described in Japanese Patent O.P.I. Publication No. 1-54440, European Patent Nos. 109,851 and 126,712, and "Journal of Imaging Science", Vol. 30, 174 (1986); (oxo)sulfonium organic boron complexes as described in Japanese Patent O.P.I. Publication Nos. 5–213861 and 5–255347; titanocenes as described in Japanese Patent O.P.I. Publication No. 61-151195; transition metal complexes containing a transition metal such as ruthenium as described in Japanese Patent O.P.I. Publication No. 2-182701 and "Coordination Chemistry Review", Vol. 84, 85-277 (1988); 2,4,5-triaryl imidazoles as described in Japanese Patent O.P.I. Publication No. 3-209477; carbon tetrabromide; and organic halogenated compounds as described in Japanese Patent O.P.I. Publication No. 59-107344. The radical polymerizasion initiator is used in an amount of preferably 0.01 to 10 weight parts based on 100 weight parts of the radical polymerizable compound used.

The imaging layer containing the radical polymerizable compound may contain a thermal polymerization inhibitor in order to prevent polymerization during storage. The thermal polymerization inhibitor includes p-methoxyphenol, hydroquinone, an alkylated hydroquinone, catechol, tert-butyl catechol, and phenothiazine. The inhibitor is used in an amount of preferably 0.001 to 5 weight parts based on 100 weight parts of the radical polymerizable compound used.

The imaging layer containing the radical polymerizable compound may further contain a polymerization promoting agent or a chain transfer cataryst such as amines, thiols, or disulfides in order to promote polymerization. The examples thereof include amines such as N-phenyl glycine, triethanolamine, and N,N-diethylaniline, thiols as disclosed in U.S. Pat. No. 4,414,312 and Japanese Patent O.P.I. Publication No. 64–13144/1988, disulfides as disclosed in Japanese Patent O.P.I. Publication No. 2-291561/1990, thions as disclosed in U.S. Pat. No. 3,558,322 and Japanese Patent O.P.I. Publication No. 64–17048/1988, o-acylthiohydroxamate or N-alkoxypyridinethions as disclosed in Japanese Patent O.P.I. Publication No. 2–291560/1990.

The imaging layer containing the radical polymerizable compound can contain a thermal polymerization initiator, which is generally used in a conventional polymerization process, in order to initiate thermal polymerization of the radical polymerizable compound. The thermal polymerization initiator herein referred to is a compound capable of generating a radical when heat is applied.

The thermal polymerization initiator includes azobisnitriles such as 2,2'-azobisisobutyronitrile or 2,2'-azobispropionitrile; organic peroxides such as benzoyl peroxide, lauroyl peroxide, acetyl peroxide, t-butyl perbenzoate, α-cumylhydro peroxide, di-t-butyl peroxide, diisopropylperoxy dicarbonate, t-butylperoxyisopropyl carbonate, peracids, alkyl peroxycarbamates, and nitrosoarylacyl amines; inorganic peroxides such as potassium persulfate, ammonium persulfate, and potassium perchlorate; azo or diazo compounds such as diazoamino benzene, p-nitrobenzene diazonium compounds, azobisalkyls, diazothioethers; arylazosulfones; nitrosophenyl urea; tetramethylthiuram disulfide; diaryl disulfides; dibenzoyl disulfide; tetraalkyl thiuram disulfides; dialkylxanthic acid disulfides; aryl sulfinic acids; arylalkyl sulfonic acids; and 1-alkane sulfinic acids. Of these, the especially preferable is an initiator, which has excellent stability at ordinary temperature and high decompsition speed on heating, and when decomposed, turns colorless, including benzoyl peroxide and 2,2'-azobisisobutyronitrile. These initiators can be used singly or in combination of two or more kinds. The initiator content of the imaging layer is preferably 0.1 to 30 weight %, and more preferably 0.5 to 20 weight %.

The cation polymerizable compound includes a cation polymerizable monomer represented by the following formula (1), (2), (3) or (4):

(1) Styrene derivative

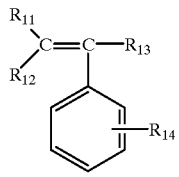

wherein $R_{11}$, $R_{12}$, and $R_{13}$ independently represent a hydrogen atom or an alkyl group; and $R_{14}$ represents a hydrogen atom, an alkyl group or an alkoxy group.

The typical compound of formula (1) includes p-methyl styrene, p-methoxy styrene, β-methyl styrene, p-methyl-β-methyl styrene, α-methyl styrene, and p-methoxy β-methyl styrene.

(2) Vinyl naphthalene derivative

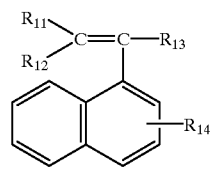

wherein $R_{11}$, $R_{12}$, and $R_{13}$ independently represent a hydrogen atom or an alkyl group; and $R_{14}$ represents a hydrogen atom, an alkyl group or an alkoxy group.

The typical compound of formula (2) includes 1-vinyl naphthalene, α-methyl-1-vinyl naphthalene, β-methyl-1-vinyl naphthalene, 4-methyl-1-vinyl naphthalene, and 4-methoxy-1-vinyl naphthalene.

(3) Vinyl ethers

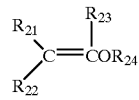

wherein $R_{21}$, $R_{22}$, and $R_{23}$ independently represent a hydrogen atom, a halogen atom or an alkyl group; and $R_{24}$ represents an alkyl group or an aromatic ring group.

The typical compound of formula (3) includes isobutyl vinyl ether, ethyl vinyl ether, phenyl vinyl ether, p-methylpheny vinyl ether, p-methoxyphenyl vinyl ether, α-methylphenyl vinyl ether, β-methylisobutyl vinyl ether, and β-chloroisobutyl vinyl ether.

(4) N-Vinyl compounds

The N-vinyl compounds include N-vinyl carbazole, N-vinyl pyrrolidone, N-vinyl indole, N-vinyl pyrrole, N-vinyl phenothiazine, N-vinyl acetoanilide, N-vinyl ethylacetamide, N-vinyl succinic imide, N-vinyl phthalimide, N-vinyl caprolactam, and N-vinyl imidazole.

The cation polymerizable compound and cation polymerization initiator are preferably used in combination. The cation polymerization initiator includes the following diazonium compound.

(1) p-Mono (or di)-alkylbenzene diazonium compound

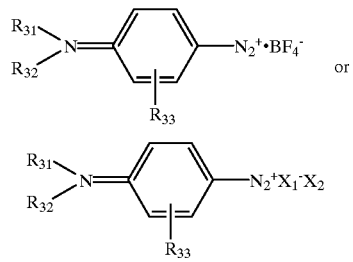

wherein $R_{31}$ and $R_{32}$ independently represent a hydrogen atom or an alkyl group, provided that $R_{31}$ and $R_{32}$ are not simultaneously hydrogen atoms, or $R_{31}$ and $R_{32}$ combine with each other to form a cycloalkyl group or a heterocyclic group; $R_{33}$ represents a substituent; $X_1^-$ represents $Cl_1^-$, $Br^-$ or $I^-$; and $X_2^-$ represents $AlCl_2$,1/2 $ZnCl_2$, or $1/4SnCl_4$.

The typical compound of the above diazonium compound includes 4-methylaminobenzene diazonium tetrafluoroborate, 4-methylaminobenzene diazonium chloride aluminum chloride, 2,5-dibutoxy-4-morpholinobenzene diazonium tetrafluoroborate, and 2,5-dibutoxy-4-morpholinobenzene diazonium chloride zinc chloride.

(2) 2,4-Disubstituted-4-acylamidobenzene diazonium compound

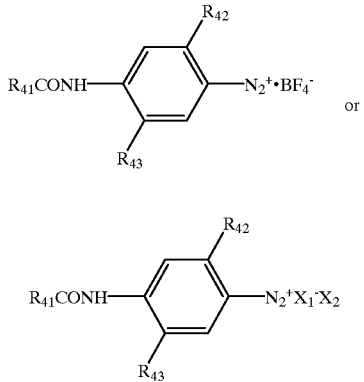

wherein $R_{41}$ represents an alkyl group or an aryl group; $R_{42}$ and $R_{43}$ independently represent an alkyl group or an alkoxy group; and $X_1^-$ and $X_2^-$ independently represent the same as denoted in above.

The typical compound of the above diazonium compound includes 2,5-diethoxy-4-benzoylaminobenzene diazonium tetrafluoroborate.

(3) 4-Phenylaminobenzene diazonium compound

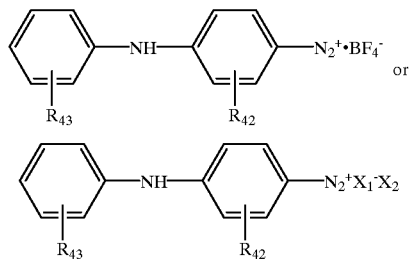

wherein $R_{42}$ and $R_{43}$ independently represent the same as denoted in above; and $X_1^-$ and $X_2^-$ independently represent the same as denoted in above.

The typical compound of the above diazonium compound includes 4-phenylaminobenzene diazonium tetrafluoroborate.

(4) Sulfur-containing diazonium compound

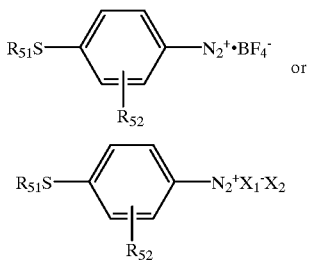

wherein $R_{51}$ represents an alkyl group or an aryl group; $R_{52}$ represents an alkyl group or an alkoxy group; and $X_1^-$ and $X_2^-$ independently represent the same as denoted in above.

The typical compound of the above diazonium compound includes 2-methoxy-4-phenylthiobenzene diazonium tetrafluoroborate.

The examples of the photo-decomposable aromatic diazonium compound in the invention have been described above, but the diazonium compounds in the invention are not limited thereto. Conventional photo-decomposable compounds used in the diazo photography, for example, photo-decomposable aromatic diazonium tetrafluoroborate, $AlCl_3$, $1/2ZnCl_2$, or $1/4SnCl_4$ salt, can be also used.

The cation polymerization initiator is preferably aromatic onium salts, and includes a salt of an element of Va group in the periodic table, for example, phosphonium salt such as hexafluorophosphoric acid triphenylphenacyl phosphonium, a salt of an element of VIa group in the periodic table, for example, sulfonium salt such as tetrafluoroboric acid triphenylsulfonium, hexafluorophosphoric acid triphenyl sulfonium, hexafluorophosphoric acid tris(4-methoxyphenyl) sulfonium, or hexafluoroantimonic acid triphenyl sulfonium, and a salt of an element of VIIa group in the periodic table, for example, iodonium salt such as chlorophenyl iodonium salt.

The use of the aromatic onium salt as a c polymerization initiator in polymerization of an epoxy compound is described in detail in U.S. Pat. Nos. 4,058,401, 4,069,055, 4,101,513 and 4,161,478.

The preferable cation polymerization initiator are sulfonium salts of an element of VIa group in the periodic table. Hexafluoroantimonic acid triaryl sulfonium is especially preferable in view of UV hardenability or storage stability.

The diazo compound used in the invention as an reactive compound may be any, as long as it is light sensitive. The diazo compound includes a condensation resin of an aromatic diazonium compound and a carbonyl compound.

The condensation resin has preferably a diazo resin having the structure represented by the following formula (11) or (12):

formula (11)

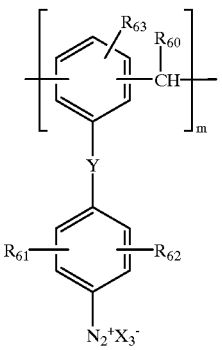

wherein $R_{60}$ represents a hydrogen atom, an alkyl group or a phenyl group; $R_{61}$, $R_{62}$ and $R_{63}$ independently represent a hydrogen atom, an alkyl group or an alkoxy group; $X_3^-$ represents an anionic group; Y represents —NH—, —O— or —S—; and m represents an integer.

formula (12)

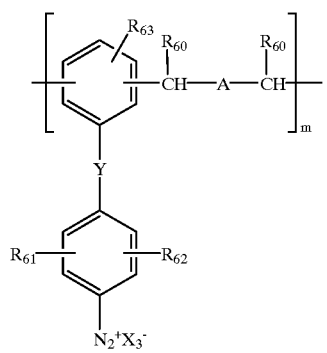

wherein A represents an aromatic group; $R_{60}$, $R_{61}$, $R_{62}$, $R_{63}$, $X_3^-$, Y and m independently represent the same as denoted above.

The aromatic diazonium compound unit contained in the above diazo resin represented by formula (11) or (12) includes the diazonium salts as disclosed in Japanese Patent Publication No. 49–48001, and is preferably diphenylamine-4-diazonium salts. The diphenylamine-4-diazonium salts are derived from 4-amino-diphenylamines. The 4-aminodiphenylamines include 4-aminodiphenylamine, 4-amino-3-methoxydiphenylamine, 4-amino-2-methoxydiphenylamine, 4'-amino-2-methoxydiphenylamine, 4'-amino-4-methoxydiphenylamine, 4-amino-3-methyldiphenylamine, 4-amino-3-ethoxydiphenylamine, 4-amino-3-(β-hydroxyethoxy)diphenylamine, 4-aminodiphenylamine-2-sulfonic acid, 4-aminodiphenylamine-2-carboxilic acid and 4-aminodiphenylamine-2'-carboxilic acid. The preferable are 4-aminodiphenylamine and 4-amino-3-methoxydiphenylamine.

The aromatic compound used to incorporate the aromatic group A in formula (12) includes m-chlorobenzoic acid, diphenylacetic acid, phenoxyacetic acid, p-methoxyphenylacetic acid, p-methoxybenzoic acid, 2,4-dimethoxybenzoic acid, p-phenoxybenzoic acid, 4-anilinobenzoic acid, 4-(m-methoxyanilino) benzoic acid, 4-(p-methylbenzoyl) benzoic acid, 4-(p-methylanilino) benzoic acid, phenol, xylenol, resorcin, 2-methylresorcin, methoxyphenol, ethoxyphenol, catechol, phloroglucin, p-hydroxyethylphenol, naphthol, pyrrogallol, hydroquinone, p-hydroxybenzyl alcohol, 4-chlororesorcin, biphenyl-4,4'-diol, 1,2,4-benzene triol, bisphenol A, 2,4-dihydroxy benzophenone, 2,3,4-trihydroxy benzophenone, p-hydroxyacetophenone, 4,4'-dihydroxydiphenyl ether, 4,4'-dimethoxydiphenyl ether, 4,4'-dihydroxydiphenyl amine, 4,4'-dihydroxydiphenyl sulfide, cumylphenol, chlorophenol, bromophenol, salicylic acid, p-hydroxybenzoic acid, 2-methyl-4-hydroxybenzoic acid, 2,4-dihydroxybenzoic acid, 2,6-dihydroxybenzoic acid, 3,5-dihydroxybenzoic acid, 4-chloro-2,6-dihydroxybenzoic acid, 4-methoxy-2,6-dihydroxybenzoic acid, gallic acid, phloroglucinol carboxylic acid, N-(4-hydroxyphenyl)methacryl amide, N-(4-hydroxyphenyl)acryl amide, cinnamic acid, methyl cinnamate, ethyl cinnamate, p-hydroxy cinnamic acid, styrene, hydroxy styrene, stilbene, 4-hydroxy stilbene, 4,4'-dihydroxy stilbene, 4-carboxy stilbene, 4, 4'-dicarboxy stilbene, diphenyl ether, diphenyl ether, diphenyl thioether, 4-methoxydiphenyl ether, 4-methoxydiphenyl amine, and 4-methoxydiphenyl thioether.

Of these diazo resins, the especially preferable is a diazo resin having a carboxy group in the molecule. The diazo resin having a carboxy group in the molecule includes a diazo resin of formula (12), in which the aromatic group represented by A has a carboxy group. The aromatic compound used to incorporate A in formula (12) is preferably p-hydroxybenzoic acid, p-methoxybenzoic acid, p-hydroxycinnamic acid, and phenoxyacetic acid.

The diazo resin is obtained by condensating an aromatic diazonium salt and optionally, an aromatic compound providing the aromatic group represented by A in formula (12), with an active carbonyl compound such as paraformaldehyde, acetoaldehyde, benzaldehyde, acetone or acetophenone in a sulfuric acid, phosphoric acid or hydrochloric acid solution, according to a conventional method as disclosed in Photo. Sci. Eng., Vol. 17, 33 (1973), U.S. Pat. Nos. 2,063,631 and 2,679,498, and Japanese Patent Publication No. 49–48001.

In formula (12), an aromatic compound used to provide the aromatic group represented by A, an aromatic diazo compound and an active carbonyl compound may be any combination, and condensation reaction can be carried out employing two or more kinds of each.

In condesation reaction, the amount used of the aromatic compound used to provide the aromatic group represented by A is preferably 0.1 to 10 times by mol, more preferably 0.2 to 2 times by mol, and most preferably 0.2 to 1 time by mol the amount of the aromatic diazonium compound. The amount of the active carbonyl compound is preferably 0.5 to 1.5 times by mol, and more preferably 0.6 to 1.2 times by mol the total amount of the aromatic compound and the aromatic diazonium compound. The above mixture of the active carbonyl compound, the aromatic compound and the aromatic diazonium compound is reacted at lower temperature for short time, for example, about 3 hours, to obtain the diazo resin in the invention.

Any synthetic methods for manufacturing the diazo resin having a carboxy group in the molecule can be used. The examples thereof include (a) a polycondensation reaction of aromatic diazonium salts, aromatic carboxylic acids, and active carbonyl compounds, (b) a polycondensation reaction of aromatic diazonium salts having a carboxylic acid, and active carbonyl compounds, and (c) a polycondensation reaction of aromatic diazonium salts and active carbonyl compounds having a carboxylic acid. The method (a) is preferable in view of ease of manufacture and availability of raw materials.

The counter anion of the above diazo resin is preferably such that a stable diazonium salt is formed and the salt formed is soluble in an organic solvent. The acid providing such an anion includes an organic acid such as decanoic acid or benzoic acid, an organic phosphoric acid such as phenylphosphoric acid, and an organic sulfonic acid. The typical examples include an aliphatic or aromatic sulfonic acid such as methane sulfonic acid, chloroethane sulfonic acid, dodecane sulfonic acid, benzene sulfonic acid, toluene sulfonic acid, mesitylene sulfonic acid, anthraquinone sulfonic acid, naphthyl sulfonic acid, or an alkylated naphthyl sulfonic acid; a halogen-containing Lewis acid such as hexafluorophosphoric acid or tetrafluoroboric acid; a perchlorate such as perchloric acid or periodic acid. The examples are not specifically limited. Of these, the preferable is hexafluorophosphoric acid or tetrafluoroboric acid.

The molecular weight of the diazo resin used in the imaging layer is not specifically limited, and varies depending on the manufacturing conditions such as the mole content of components used in polycondensation and polycondensation conditions. The diazo resin has generally a molecular weight of 400 to 10,000, preferably 800 to 5,000.

The diazo resin content of the imaging layer is preferably 0 to 40 weight %, and more preferably 0.5 to 30 weight %.

The coupling agent includes a titanium coupling agent, a silane coupling agent and an aluminum coupling agent.

The titanium coupling agent includes i-propyl-i-stearoyl titanate, i-propyltridecylbenzenesulfonyl titanate, i-propyl-i-stearoyl titanate, i-propyltri(dioctylpyrophosphate)titanate, tetra-i-propylbis(ditridecylphosphite) titanate, tetraoctyl-bis (ditridecylphosphite) titanate, tetra(2, 2-diallyloxymethyl-1-butyl)bis(ditridecylphosphite) titanate, and bis (dioctylpyrophosphate)oxyacetate titanate.

The silane coupling agent includes vinyl trichloro silane, vinyl trimethoxy silane, vinyl triethoxy silane, vinyl tris(2-methoxyethoxy) silane, N-(2-aminoethyl)-3-aminopropyl methyl dimethoxy silane, N-(2-aminoethyl)-3-aminopropyl trimethoxy silane, 3-aminopropyl triethoxy silane, 3-glycidoxypropyl trimethoxy silane, 2-(3,4-epoxycyclohexyl)ethyl) trimethoxy silane, 3-chloropropyl trimethoxy silane, 3-methacryloxypropyl trimethoxy silane, 3-mercaptopropyl trimethoxy silane, and 3-ureidopropyl triethoxy silane.

The aluminum coupling agent includes acetoalkoxyaluminum di-i-propylate.

Of the above reactive compounds, the coupling agent having a glycidyl group or the radical polymerizable compound having a phosphoric acid group is especially preferable, in that it provides excellent adhesion of the imaging layer to a recording medium (such as the support in the invention) or excellent printing durability.

In the invention, the imaging layer of the sublimation transfer sheet for manufacturing a printing plate comprises a base and provided thereon, a light absorbing layer containing a light-heat converting agent and an adhesion layer containing the above described reactive compound, the adhesion layer and the light absorbing layer being provided on the base in that order. The light absorbing layer is comprised of the light-heat converting agent or is comprised of a binder and the light-heat converting agent dispersed in the binder.

The thinner the light absorbing layer is, the better. The thickness of the light absorbing layer is preferably not more than 0.5 $\mu$m, and more preferably not more than 0.2 $\mu$m. However, when the light absorbing layer has an adhesion property, the thickness of the light absorbing layer is preferably not more than 2.0 $\mu$m.

The adhesion layer, when used for manufacturing a printing plate, preferably contains a thermoplastic binder showing printing ink receptibility and excellent adhesion to a recording medium (such as the support in the invention). The thermoplastic binder includes the binder used in the imaging layer as described above. The adhesion layer can further contain the above described reactive compound in order to give a sufficient adhesion to the recording medium. The reactive compound content of the adhesion layer is preferably 5 to 200 parts by weight based on 100 parts by weight of the thermoplastic binder.

The adhesion layer can contain various additives in addition to the above described. The additives include a thermal polymerization inhibitor, an oxygen quencher, a plasticizer, an acid generating agent, a visualizing agent and a matting agent.

The thermal polymerization inhibitor is preferably a quinone or phenol type compound, for example, hydroquinone, pyrogallol, p-methoxyphenol, catechol, β-naphtol or 2,6-di-t-butyl-p-cresol. The inhibitor content is not more than 10 parts by weight, and preferably 0.01 to 5 parts by weight based on the 100 parts by weight of a polymerizable ethylenically unsaturated compound and a binder. The oxygen quencher is preferably an N,N-dialkylaniline derivative, for example, a compound disclosed in column 11, line 58 to column 12, line 35 of U.S. Pat. No. 4,772,541.

The plasticizer includes phthalates, trimellitates, adipates, or another saturated or unsaturated carboxylate, citrates, epoxy soybean oil, epoxy linseed oil, epoxystearic epoxides, phosphates, phosphites, and glycol esters.

The acid generating agent, which generates an acid by heating and promotes decomposition of an initiator, includes diphenyl iodonium salts and 1,3,5-triarylsulfonium salts and triazines.

The adhesion layer may contain dyes or pigment as a visualizing agent, and may contain a matting agent having a particle size not less than the adhesion layer thickness. The matting agent, when a recording medium, onto which the adhesion layer is transferred, has a smooth surface (Ra of less than 0.5 $\mu$m, lowers adhesion of the adhesion layer to the recording medium to reduce heat conductivity, resulting in improving transferability due to ablation. The adhesion layer can be divided into a reactive adhesion layer containing a reactive compound and a lipophilic adhesion layer.

The thickness of the adhesion layer is preferably 0.2 to 3 $\mu$m, and more preferably 0.5 to 3 $\mu$m.

The donor sheet in the invention can optionally comprise another layer such as a back coat layer, for example, an anti-static layer or a transportability improving layer.

In manufacturing the printing plate in the invention, the transfer layer of the donor sheet is imagewise transferred onto the support in the invention to form an image on the support, and then heat, light or pressure is preferably applied to the formed image on the support to increase adhesion between the formed image and the support.

When a radical polymerizable monomer, a cation polymerizable compound, or a diazo compound is used as a reactive compound, adhesion between the formed image and the support is increased preferably by UV light irradiation, and UV light irradiation may be carried out while heating. When a radical polymerizable monomer, a silane coupling agent or a titanium coupling agent is used as a reactive compound, adhesion between the transferred adhesion layer and the support is increased preferably by heating (including heating by micro waves).

The transferred imaging layer on the support is preferably heated at a temperature not less than a softening point of the binder and pressed by heated rollers such as silicone rubber rollers. This heat and pressure application increases the contact area between the imaging layer and the support, resulting in an increase of adhesion between the imaging layer and the support. The adhesion increasing process is especially effective, when imagewise exposure is carried out employing a laser with an illuminance of not less than 1 mW/cm$^2$. The exposed imaging layer, which is heated to high temperature, is ablated, and transferred to the support in the invention. However, high illuminance exposure results in a narrow heated area of the imaging layer, and the heat does not sufficiently reach the surface of the adhesion layer, resulting in insufficient adhesion between the adhesion layer and the support. When the support is a surface roughened printing plate support, the imaging layer is contact only with protrusion portions of the support, and transferred in a cross-linked state to the support, resulting in poor adhesion. The heat and pressure application increases adhesion at the retraction portions of the support, and adhesion between the imaging layer, resulting in an increase of adhesion between the imaging layer and the support. The heat application is carried out at a temperature preferably not less than a softening point of a thermoplastic binder used.

The heating method in the imaging layer adhesion increasing method in the invention includes a heating and pressing method employing heated rubber rollers, a non-contact heating method employing an oven and a heating method employing micro waves. Of these heating method, the heating and pressing method employing heated rubber rollers is especially preferable in that an area, at which the imaging layer contacts the support, is increased. As the heated rubber rollers, heated silicone rubber rollers are preferably used in order to prevent the imaging layer from adhering to the rollers.

The temperature for heating is preferably not less than a softening point of a thermoplastic binder contained in the adhesion layer, and it is necessary that the temperature is not less than a temperature initiating thermal polymerization in an imaging layer containing a thermal polymerizable composition, and is, in an imaging layer containing a silane coupling agent or a titanium coupling agent, not less than a temperature initiating its reaction. When a radical polymerizable monomer or a cation polymerizable compound is used as a reactive compound, polymerization is carried out by UV light irradiation, and when heat and pressure are applied before the polymerization, adhesion between the formed image and the recording medium is increased. It is preferably that UV light irradiation is carried out while heating. It is necessary that exposure or heating conditions are suitably determined according to a recording medium, kinds of adhesion layer or illuminance at image exposure.

The above described sublimation transfer sheet, heat fusion transfer sheet and ablation transfer sheet have a sublimation agent containing layer, a heat fusible layer and an ablation layer on a base, respectively. The method of providing such a layer on a base includes a coating method which comprises dissolving or dispersing each layer composition in a solvent to obtain a coating solution, coating the solution on the base, and drying, or a transfer method which comprises forming each layer on a peelable sheet, and transferring the layer to the base by applying heat and/or pressure.

The solvent includes alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), amide type solvents (dimethylformamide, N-methylpyrrolidone).

The kneaders for an image forming layer composition Suitable examples include two-roll mills, three-roll mills, ball mills, pebble mills, coball mills, Tron mills, sand mills, sand grinders, Sqegvari attritor, high-speed impeller dispersers, high-speed stone mills, high-speed impact mills, dispersers, high-speed mixers, homogenizers, supersonic dispersers, open kneaders, and continuous kneaders.

In the invention, a method of preparing a printing plate comprises the steps of superposing the support in the invention on the transfer layer of the donor sheet, and applying heat, light or pressure, for example, employing a thermal head or a laser, to the superposed material, and then imagewise transferring the transfer layer to the support to form an image on the support.

Any thermal head can be used, as long as the thermal head can thermally transfer a transfer layer to be transferred to an image receiving material and form an image on the image receiving material according to information. The heating elements according to information are provided in the thermal head. When information is printing pattern, heating elements, in which dot elements are arranged and heated in a matrix, are preferably used.

The laser light used in the invention is well known. The laser source includes solid lasers such as a ruby laser, a YAG laser, a glass laser, a gas laser such as a He-Ne laser, a Ar laser, a Kr laser, a $Co_2$ laser, a Co laser, a He-Cd laser, a $N_2$ laser, an eximer laser, an semiconductor laser such as a InGaP laser, a AlGaAs laser, a GaAsP laser, a InGaAs laser, a InAsP laser, $CdSnP_2$ laser or a GaSb laser, a chemical laser, and a dye laser. Of these laser light sources, a YAG laser and an semiconductor laser, each emitting a light in the near infrared regions, is especially preferable.

A conventional printing press is used in printing employing the printing plate in the invention. That is, a rotary off-set or direct printing press, or a sheet-fed off-set or direct printing press is used.

The printing plate obtained as described above is mounted on a plate cylinder of a planographic press, and to the printing plate, ink is supplied from ink rollers, which contacts the printing plate, and dampening water is supplied from a dampening water supplying section. The non-image portions of the printing plate receives the dampening water, which permeates and accumulates in the void layer which works as a water holding layer. On the other hand, the image portions of the printing plate receive ink, and the ink is transferred to the off-set blanket or the material to be printed to form a printing image.

Dampening water, which is used when printing is carried out employing the printing plate in the invention, may be an etching liquid used in a conventional PS plate.

EXAMPLES

The invention will be detailed in the following examples, but the invention is not limited thereto. In the examples, all parts are by weight, unless otherwise specified.

Preparation of Support I

In 1000 ml of pure water, 150 g of primary order fine silica particles with an average particle size of about 7 nm were incorporated and dispersed by means of a high-speed homogenizer to obtain a transparent pale silica dispersion. To the resulting dispersion 1 liter of an aqueous 2% polyvinyl alcohol solution (having an average polymerization degree of 4,000 and a saponification degree of 88% and containing ethyl acetate in an amount of 3 weight %) were gradually added and then 28 ml of an aqueous 4% borax solution was added and dispersed by means of a high-speed homogenizer to obtain a translucent white coating solution. In this coating solution, the silica contained 7.5 times by weight the amount of the polyvinyl alcohol.

The resulting coating solution was coated at 40° C. on a 100 $\mu$m thick polyethylene terephthalate (PET) film, and cooled to 15° C. for 20 seconds to reach its gel state. Thereafter, 23° C. air flow was supplied for 20 seconds, 30° C. air for 40 seconds, 40° C. air flow for 60 seconds, and 45° C. air flow for 70 seconds, onto the coated film and dried. The resulting material was conditioned at 25° C. and 50% RH for 30 seconds. Thus, support I was obtained.

The section of the support I was observed employing an electron microscope, which proved that the void layer in the invention was formed. The thickness of the void layer was 40 $\mu$m. The void volume was 24.7 ml/m$^2$, which was measured with a Bristow tester Type II (pressure type) produced by Kumagaya Rikikogyo Co., Ltd. The void volume was obtained as an absorption amount, at a contact time of 2 seconds.

Preparation of Support II

A 0.24 mm thick aluminum plate (material 1050, quality H16) was degreased at 60° C. for one minute in a 5% sodium hydroxide solution, washed with water, and electrolytically etched at 25° C. for 30 seconds at a current density of 60 A/dm$^2$ in one liter of a 0.5 M hydrochloric acid solution, desmut at 60° C. for 10 seconds in a 5 weight % sodium hydroxide solution, and then anodized at 20° C. for one minute at a current density of 3 A/dm$^2$ in a 20 weight % sulfuric acid solution. The resulting aluminum plate was sealed at 80° C. for 20 seconds with an aqueous 1.5% sodium silicate (No. 3) solution, and washed with water to obtain support II. The void volume of support II was 0.15 ml/m$^2$.

Preparation of Support III

A coating solution having the following composition was coated at 40° C. on a 100 μm thick PET film, whose surface was plasma treated, with a bar coater, and dried at 60° C. for 20 minutes to give a dry thickness of 10 g/m$^2$. Thus, support III was obtained. The void volume of support III was 1.07 ml/m$^2$.

Coating Solution Composition

| | |
|---|---|
| Zinc oxide | 56 parts |
| (SAZEX #2000 made by Sakai Kagaku Co., Ltd.) | 10 parts |
| Acryl resin | |
| (Diyanal LR-188 made by Mitsubishi Rayon Co., Ltd.) | 1.0 part |
| Maleic anhydride | |
| Toluene | 33 parts |

To the above composition, 30 parts of glass beads were added and dispersed for 2 hours by a paint shaker to obtain the coating solution.

Preparation of support IV

A coating solution with 15 weight % of solid components, polyvinyl alcohol (PVA having a saponification degree of 98.5% and a polymerization degree of 2400) and aluminum sol prepared by hydrolyzing aluminum isopropoxide (PVA/aluminum sol=0.11 by weight), was coated on a 100 μm thick PET film, with a die coater, and dried to give a pseudo-bohemite layer with a dry thickness of 30 μm.

A silica sol coating solution with 5 weight % of solid components, silica sol with a primary order particle size of 35 to 55 nm and a silicon-containing PVA (Polymer R-1130 produced by Kuraray Co., Ltd.) (R-1130/SiO$_2$=0.1 by weight), was coated on the above pseudo-bohemite layer, with a gravure coater, dried, and heated at 140° C. to give a silica sol layer with a thickness of 200 nm. Thus, support IV was obtained. The void volume of support IV was 15.8 ml/m$^2$. Preparation of base for donor sheet A 100 μm thick transparent polyethylene terephthalate film (T-100G: produced by Diafoil Hoechst Co., Ltd.) was subjected to anti-static treatment on one side of the surface and subjected to corona discharge treatment on the imaging layer side surface. Thus, a base for a donor sheet was obtained.

Preparation of Donor Sheets I and II

A coating solution for light absorbing layer having the following composition was kneaded and dispersed with an open kneader, coated on the base for donor sheet described above by an extrusion coating method, dried, subjected to calendering at a pressure of 2000 kg/cm, and cured at 60° C. for 72 hours, whereby the light absorbing layer was thermally hardened. The thickness of the light absorbing layer was 0.5 μm.

Coating Solution for Light Absorbing Layer

| | |
|---|---|
| Fe—Al ferromagnetic metal powder* | 100 parts |
| Vinyl chloride resin | 10 parts |
| (MR105 made by Nippon Zeon Co., Ltd.) | |
| Polyurethane resin | 10 parts |
| (UR8700 made by Toyobo Co., Ltd.) | |
| α-Alumina (average particle size: 0.15 μm) | 8.0 parts |
| Carbon black (average particle size: 0.04 μm) | 0.5 parts |
| Stearic acid | 1.0 part |
| Butyl stearate | 1.0 part |
| Polyisocyanate (Coronate L made | 5.0 parts |
| by Nihon Urethane Kogyo Co., Ltd.) | |
| Cyclohexanone | 100 parts |
| Methyl ethyl ketone | 100 parts |
| Toluene | 100 parts |

*(Fe:Al ratio in number of atoms:overall average = 100:4, surface layer = 50:50, average major axial length = 0.14 μm, Hc: 1760 Oe, σs: 120 emu/g, BET value = 53 m$^2$/g)

Coating solutions (I) and (II) for an imaging layer having the following compositions were coated on the light absorbing layer described above by an extrusion coating method, and dried to give a dry thickness of 0.5 g/m$^2$. Thus, donor sheets (I) and (II) were obtained.

Coating Solution (I) for Imaging Layer

| | |
|---|---|
| Lipophilic thermoplastic binder (Polymer A) | 4 parts |
| Dye (Visualizing agent, 20% phthalocyanine blue methylethyl ketone dispersion solution) | 10 parts |
| Radical polymerizable monomer (Pentaerythritol tetraacrylate) | 3.6 parts |
| Radical polymerization initiator (2,4-diethylthioxanthone) | 0.2 parts |
| Ethyl p-dimethylaminobenzoate | 0.2 parts |
| Matting agent (Tospar 130 produced by Toray Co., Ltd.) | 0.5 parts |
| Methylethyl ketone | 70 parts |

Coating Solution (II) for Imaging Layer

| | |
|---|---|
| Lipophilic thermoplastic binder (Polymer A) | 4 parts |
| Dye (Visualizing agent, 20% phthalocyanine blue methylethyl ketone dispersion solution) | 10 parts |
| Diazo resin A | 2 parts |
| Matting agent (Tospar 130 produced by Toray Co., Ltd.) | 0.5 parts |
| Methylethyl ketone | 100 parts |

Polymer A: Methyl methacrylate-ethyl acrylate-acrylonitrile-methacrylic acid-glycerol-1,3-dimethacrylate (60/20/8/11.1/0.6, by molar ratio) copolymer (Tg=76° C.)

Synthesis of Diazo Resin A

In 200 g of ice-cooled concentrated sulfuric acid, 12.7 g (0.092 mol) of p-hydroxybenzoic acid and 40.5 g (0.138 mol) of 4-diazophenylamine sulfate were gradually added and stirred at a temperature not exceeding 5° C., and dissolved. To the resulting solution, 6.22 g (0.297 mol) of paraformaldehyde was gradually added in one hour, wherein polycondensation reaction was carried out at a temperature not exceeding 5° C. After the addition, the reaction mixture was further stirred at not more than 5° C. for additional 30 minutes.

The resulting reaction mixture was gradually added to 1600 ml of ethanol cooled to 0° C. to produce precipitates, wherein the mixture was maintained at not more than 40° C. The resulting precipitates were filtered off under reduced pressure, and washed with 300 ml of alcohol to obtain an intermediate a (a diazo resin sulfate).

The intermediate a was dissolved in 240 ml of water, and 19.04 g (0.14 mol) of zinc chloride, which were dissolved in 90 ml of water, were added to produce precipitates. The resulting precipitates were filtered off under reduced pressure to obtain an intermediate b (a diazo resin zinc chloride sulfate).

The intermediate b was dissolved in 1000 ml of water, and 24.8 g (0.15 mol) of ammonium hexafluorophosphate, which were dissolved in 100 ml of water, were added to produce precipitates. The resulting precipitates were filtered off under reduced pressure, washed with 300 ml of alcohol, and dried at 30° C. for three days. Thus, 32.4 g of diazo resin A was obtained.

Preparation of Donor Sheets III and IV

One hundred μm thick transparent polyethylene terephthalate film (T-100G: produced by Diafoil Hoechst Co., Ltd.) was subjected to anti-static treatment on one side of the surface to obtain a base for donor sheet. Coating solutions for imaging layer having the following compositions were coated on the surface of the base opposite the side subjected to anti-static treatment, and dried to give a dry thickness of the imaging layer of 0.5 g/m². Thus, donor sheets III and IV were obtained.

Coating Solution (III) for Imaging Layer

| Coating solution (III) for imaging layer | |
|---|---|
| Lipophilic thermoplastic binder (Polymer A) | 4 parts |
| Light-heat converting agent (20% carbon black methylethyl ketone dispersion solution) | 4.2 parts |
| Radical polymerizable monomer (Pentaerythritol tetraacrylate) | 3.6 parts |
| Radical polymerization initiator (2,4-diethylthioxanthone) | 0.2 parts |
| Ethyl p-dimethylaminobenzoate | 0.2 parts |
| Matting agent (Tospar 130 produced by Toray Co., Ltd.) | 0.5 parts |
| Methyl ethyl ketone | 70 parts |
| Coating solution (IV) for imaging layer | |
| Lipophilic thermoplastic binder (Polymer A) | 4 parts |
| Light-heat converting dye (CY-1) | 0.7 parts |
| Diazo resin A | 2 parts |
| Matting agent (Tospar 130) | 0.5 parts |
| Methylethyl ketone | 100 parts |

CY-1

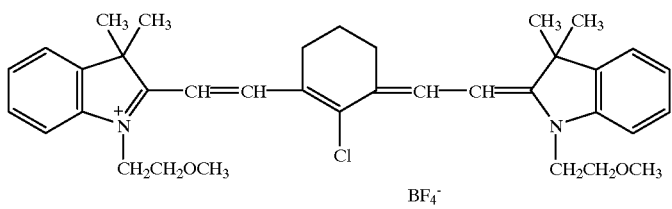

Preparation of Light Sensitive Composition Coating Solution

A light sensitive composition coating solution I having the following composition was prepared.

Light Sensitive Composition Coating Solution I

| Polymer B | 8.0 g |
|---|---|
| DPHA (dipentaerythritol hexaacrylate) | 2.0 g |
| 2,4-Bis(trichloromethyl)-6-(p-methoxystyryl)-s-triazine | 0.3 g |
| Diazo resin B* | 1.5 g |
| Succinic acid | 0.4 g |
| Fluorine-containing surfactant (FC-430 produced by Sumitomo 3M Co., Ltd.) | 0.01 g |
| Dye (Victoria Pure Blue BOH produced by Hodogaya Kagaku Co., Ltd.) | 0.02 g |
| Methyl lactate | 180 ml |
| 2-Ethoxypropanol | 20 ml |

*Diazo resin B: Diazodiphenylamine.p-hydroxybenzoic acid (75/25 by molar ratio) copolycondensate mesitylenesulfonic acid salt (Average weight molecular weight: 3400)

Preparatiion of Polymer B

In a four necked flask with a thermometer, a condenser, a stirrer and a nitrogen incorporating tube, a mixture solvent of 50 ml of acetone and 50 ml of methanol was placed, and 26.02 g of p-hydroxyphenyl methacryl amide, 1.29 g of methacrylic acid, 6.63 g of acrylonitrile, 18.24 g of ethyl methacrylate and 0.62 g of azobisisobutyronitrile as a polymerization initiator were dissolved in the mixture solvent. Nitrogen was incorporated in the flask, and the resulting mixture was heated and refluxed with stirring under nitrogen atmosphere. After reaction, 0.050 g of hydroquinone as a reaction terminating agent were added to complete polymerization.

After polymerization, the resulting solution was cooled to room temperature, and mixed with 5 liter of water to produce precipitates. The resulting precipitates were filtered off and dried to obtain polymer B. The weight average molecular weight of the polymer was 145,000 in terms of pullulan, measured according to gel permeation chromatography, employing N-dimethylformamide as a solvent.

Example 1

Supports I and II were coated with the light sensitive composition coating solution I and dried at 80° C. for 2 minutes to give a light sensitive layer with a dry thickness of 1.6 g/m², and to obtain presensitized planographic printing plate samples 1 and 2, respectively.

The resulting samples were exposed through Step Tablet (produced by Eastman Kodak Co., Ltd.), an optical wedge having an optical density difference per step of 0.15, and a transparent original with a negative image employing a printer for a PS plate and a 2 KW metal halide lamp. The exposure was determined in such a manner that three solid steps of the Step Tablet were reproduced when the samples were developed with a developer having the following composition at 32° C. for 15 seconds, washed with water, and dried. Thus, planographic printing plate samples 1 and 2 were obtained.

| (Developer composition) | |
|---|---|
| Phenyl glycol | 180.0 g |
| Diethanolamine | 85.5 g |
| Dibutylnaphthalene sulfonate | 93.0 g |
| Pure water | 3835 ml |

Samples 1 and 2 were evaluated at a dot image portion (a shadow portion) corresponding to a screen line number of 175 and a dot area of 98%. Sample 1 reproduced the dot image, the shadow portion with the dot area of 98%, but Sample 2 did not, resulting in insufficient screen opening.

Each of the developed samples was mounted on a printing press DAIYA1F-1 (produced by Mitsubishi Jukogyo Co., Ltd.), and printing was carried out employing coat paper, a dampening water (an etching solution SG-51 produced by Tokyo Ink Seizou Co., Ltd., having a concentration of 1.5%) and ink (Hyplus M Magenta produced by Toyo Ink Manufacturing Co., Ltd.), varying a supplying amount of the dampening water to the sample. Stains at non-image portions were evaluated when the dampening water supplying amount was small, and emulsification of ink was evaluated when the dampening water supplying amount was large. Evaluation was carried out according to the five step evaluation criteria, in which 5 is excellent, and 4, 3, 2 and 1 is poor in stains or emulsification of ink in that order. The results are shown below:

| Sample No. | Emulsification of ink | Stains at non-image portions |
|---|---|---|
| 1 | 5 | 5 |
| 2 | 3 | 2 |

Example 2

A presensitized planographic printing plate sample was prepared in the same manner as in sample 1 of Example 1, except that support IV was used instead of support I, and evaluated for dot reproduction, emulsification of ink and stains at non-image portions in the same manner as in Example 1. As a result, the advantageous effects of the invention were obtained.

Example 3

The support I was provided on a drum of an apparatus described in Japanese Patent O.P.I. Publication No. 9-226244 and donor sheet I was further provided on the support I, so that the imaging layer contacted the void layer of the support. The resulting material was scanning exposed with a recording energy of 350 mJ/cm$^2$, employing a laser diode emitting light of 830 nm with an exposure energy of 100 mW (illuminance: 0.32 mW/cm$^2$) at the surface to be exposed of the material, to form an image. Then, the donor sheet was separated from the support, and the support with the formed image was passed between two silicone rubber rollers of 110° C., whereby heat and pressure were applied. The pressure between the rollers was 2 kg/cm$^2$, and the heating time was 5 seconds. The resulting material was entirely exposed to a 2 KW metal halide lamp (Idorfin 2000 produced by Iwasaki Denki Co., Ltd.) for 70 seconds 90 cm distant from the lamp to increase adhesion between the support and the formed image. Thus, printing plate sample 11 was obtained.

Printing plate sample 12 was prepared in the same manner as in printing plate sample 11, except that support II was used instead of support I.

Each of samples 11 and 12 was mounted on a printing press DAIYA1F-1, and printing was carried out employing coat paper, a dampening water (an etching solution SG-51 having a concentration of 1.5%) and ink (Hyplus M Magenta), varying a supplying amount of the dampening water to the samples. Stains at non-image portions were evaluated when the dampening water supplying amount was small, and emulsification of ink was evaluated when the dampening water supplying amount was large. Evaluation was carried out according to the five step evaluation criteria, in the same manner as in Example 1. The results are shown below:

| Sample No. | Emulsification of ink | Stains at non-image portions |
|---|---|---|
| 11 | 5 | 5 |
| 12 | 3 | 2 |

Example 4

Printing plate samples 21 and 22 were prepared in the same manner as in Example 3, except that the recording energy was varied instead of 350 MJ/cm$^2$.

When the recording energy was such that the width of lines and spaces of 2000 dpi was reproduced to be 1:1, small dots corresponding to a screen line number of 175 and a dot area of 2% were evaluated. As a result, sample 22 exhibited blurred dots with fringes, but sample 21, which employed support I, exhibited dots with no fringes.

Example 5

Printing plate sample 31 was prepared in the same manner as in Example 3, except that support III was used instead of support I and donor sheet IV was used instead of donor sheet I.

Printing plate sample 32 was prepared in the same manner as in Example 3, except that support IV was used instead of support I and donor sheet IV was used instead of donor sheet I.

Each of samples 31 and 32 was mounted on a printing press HEIDEL GTO, and printing was carried out employing coat paper, a dampening water (a 2.5% aqueous solution of SEU-3 produced by Konica Corporation) and ink (Hyplus M Magenta). Printing plate sample 31 produced stains at non-image portions immediately after beginning of printing, but printing plate sample 32 did not produce stains at non-image portions even after 10,000 prints.

Printing sample 31 was treated with a PP clean H solution produced by Nikken Kagaku Co., Ltd., and then, printing was carried out in the same manner as above, except that a 5% aqueous solution of PP clean H solution was used instead of a 2.5% aqueous solution of SEU-3 as a dampening water. The PP clean H solution treated printing plate sample 31 produced stains at non-image portions after 1,000 prints.

Example 6

Printing plate sample 41 was prepared in the same manner as in planographic printing plate sample 11 of Example 3, except that donor sheet II was used instead of donor sheet I, and scanning exposure was carried out from the inside of the drum with an exposure energy of 4 W (illuminance of 8 mW/cm$^2$) at the surface to be exposed of the material employing a laser emitting light of 1064 nm. Printing plate sample 42 was prepared in the same manner as in planographic printing plate sample 12 of Example 3, except that donor sheet II was used instead of donor sheet I, and scanning exposure was carried out from the inside of the drum with an exposure energy of 4 W (illuminance of 8 mW/cm$^2$) at the surface to be exposed of the material employing a laser emitting light of 1064 nm.

Regarding the above obtained samples, evaluation of small dots were carried out in the same manner as in Example 4, and as a result, sample 42 exhibited blurred dots with fringes, but sample 41, which employed support I, exhibited dots with no fringes.

Example 7

Printing plate sample 51 was prepared in the same manner as in printing plate sample 41 of Example 6, except that donor sheet III was used instead of donor sheet II. Printing plate sample 52 was prepared in the same manner as in planographic printing plate sample 42 of Example 6, except that donor sheet III was used instead of donor sheet II. Regarding the above obtained samples, evaluation of small dots were carried out in the same manner as in Example 4, and as a result, sample 52 exhibited blurred dots with fringes, but sample 51, which employed support I, exhibited dots with no fringes.

Example 8

A thermal transfer layer coating solution having the following composition was coated on a 3.5 μm thick PET film with a wire bar, and dried to give a thermal transfer layer with a dry thickness of 3 μm. Thus, thermal transfer ribbon was prepared.

Thermal Transfer Layer Coating Solution

| | |
|---|---|
| Carbon black (produced by Mitsubishi Kasei Co., Ltd.) | 20 parts |
| Carnauba wax | 60 parts |
| Pentaerythritol tetraacrylate | 20 parts |
| Di-i-propylthioxanthone | 2 parts |
| i-Amyl dimethylaminobenzoate | 1 part |
| Xylene | 100 parts |

An image was formed on the support I at a printing energy of 3 mj/dot, employing the thermal transfer ribbon and a thermal printer with a thermal head (equipped with a thin layer type serial head with a heat element density of 7 dot/mm and a printing pressure of 600 g/head), and entirely exposed for 5 seconds at an exposure energy of 100 mW/cm$^2$ (at the surface to be exposed), employing a metal halide lamp to obtain printing plates. Thus, printing plate sample 61 was prepared. Printing plate sample 62 was prepared in the same manner as in sample 61, except that support II was used instead of support I. Printing was carried out in the same manner as in Example 3, except that printing plate samples 61 and 62 were used, and evaluation was carried out in the same manner as in Example 3. As a result, sample 61 exhibited superior results in ink emulsification and stains compared to sample 62.

Example 9

The coating solution (I) for imaging layer was coated on a 100 μm thick transparent PET (T-100) film, and dried at 80° C. for 2 minutes to give an imaging layer with a dry thickness of 1.6 g/m$^2$. The resulting material was provided on the support I, so that the imaging layer contacted the void layer of the support I, passed between two heat rollers heated to 110° C. to transfer the imaging layer to the void layer, and then the PET film was peeled from the support. Thus, printing plate sample 71 was obtained.

The resulting plate sample was processed in the same manner as in Example 1, and evaluated for dot reproduction, emulsification of ink and stains at non-image portions in the same manner as in Example 1. As a result, the advantageous effects of the invention were obtained.

Example 10

Supports V through IX were prepared in the same manner as in support I, except that the void layer thickness and the void volume were varied. The void layer thickness and void volume of the supports are as follows:

| | V | VI | VII | VIII | IX |
|---|---|---|---|---|---|
| Layer thickness (μm) of the void layer | 1.0 | 5.2 | 10 | 15 | 20 |
| Void volume (ml/m$^2$) of the void layer | 0.4 | 3 | 5.6 | 9.3 | 12.5 |

These supports were observed with an electron microscope, and the void layers of the supports had voids.

Printing plates were prepared in the same manner as in printing plate sample 11 of Example 3, except that the above obtained supports were used instead of support I and donor sheet II was used instead of donor sheet I, and evaluated for emulsification of ink and stains at non-image portions in the same manner as in Example 3. As a result, the advantageous effects of the invention were obtained.

Printing plates were prepared in the same manner as in printing plate sample 21 of Example 4, except that the above obtained supports were used instead of support I and donor sheet II was used instead of donor sheet I, and evaluated for small dot reproduction in the same manner as in Example 4. As a result, the advantageous effects of the invention were obtained.

Example 11

Preparation of Support X

Support X was prepared in the same manner as in support I, except that an aqueous 2% gelatin solution was used instead of an aqueous 2% polyvinyl alcohol solution. The void volume of Support X was 21.2 ml/m$^2$. Next, printing plate sample 81 was prepared in the same manner as in printing plate sample 11 of Example 3, except that support X was used instead of support I. Printing plate samples 11 and 81 were immersed in Ultra Plate Cleaner produced by Dainichi Seika Co., Ltd. for 10 minutes, and the resulting plates were evaluated in the same manner as in Example 3.

In emulsification of ink and stains at non-image portions, printing plate sample 81 exhibited the same excellent results as printing plate sample 11. The print number which printing plate sample 81 gave a good print was 500 prints or more, but on the other hand, the print number which printing plate sample 11 gave a good print was up to 3,000 prints.

What is claimed is:

1. A printing material comprising:

a support comprising a void layer with voids; and a light sensitive layer or a heat sensitive layer provided in contact with the void layer, wherein the void layer contains a hydrophilic binder and fine particles with a particle size of 0.003 to 10 μm, the hydrophilic binder being gelatin or its derivative, and the void volume of the void layer is not less than 0.01 ml/m$^2$.

2. The printing material of claim 1, wherein the void layer is provided on a substrate.

3. The printing material of claim 2, wherein the voids have an opening at the surface of the void layer on the substrate side or at the surface of the void layer opposite the substrate.

4. The printing material of claim 2, wherein the voids are voids having at least two openings at the surface of the void layer on the substrate side or at the surface of the void layer opposite the substrate.

5. The printing material of claim 1, wherein the void volume of the void layer is not less than 0.5 ml/m$^2$.

6. The printing material of claim 5, wherein the void volume of the void layer is 0.5 to 40 ml/m$^2$.

7. The printing material of claim 1, wherein the void ratio of the void layer is not less than 5% of the void layer.

8. The printing material of claim 7, wherein the void ratio of the void layer is 20 to 80% of the void layer.

9. The printing material of claim 1, wherein the void layer contains the hydrophilic binder in an amount of 0.1 to 20 g/m$^2$, and the fine particles, having an average particle size of to 200 nm, are present in a ratio of 0.5 to 15 by weight based on the weight of the hydrophilic binder.

10. The printing material of claim 1, wherein the heat sensitive layer is provided on the void layer of the support by superposing the support on a donor sheet comprising a base and provided thereon, a heat sensitive transfer layer, so that the void layer contacts the transfer layer, and then imagewise applying heat, light or pressure to the superposed material to imagewise transfer the transfer layer to the void layer.

11. The printing material of claim 1, wherein the fine particle content ratio of the hydrophilic binder in the void layer is 0.5 to 10 by volume.

12. The printing material of claim 1, wherein the fine particles are selected from the group consisting of silica, alumina, aluminum hydroxide, zinc oxide, light calcium carbonate, heavy calcium carbonate, calcium hydroxide, titanium oxide, barium sulfate, magnesium hydroxide, magnesium carbonate, kaolin, clay, talc, zeolite, aluminum silicate, diatomaceous earth, mica, synthetic hydrosulfite, potassium titanate.

* * * * *